United States Patent
Okabe et al.

(10) Patent No.: US 12,446,441 B2
(45) Date of Patent: Oct. 14, 2025

(54) DISPLAY DEVICE AND DISPLAY DEVICE MANUFACTURING METHOD

(71) Applicant: SHARP KABUSHIKI KAISHA, Sakai (JP)

(72) Inventors: Tohru Okabe, Sakai (JP); Shinsuke Saida, Sakai (JP); Shinji Ichikawa, Sakai (JP); Shoji Okazaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 454 days.

(21) Appl. No.: 17/925,848

(22) PCT Filed: Jun. 8, 2020

(86) PCT No.: PCT/JP2020/022562
§ 371 (c)(1),
(2) Date: Nov. 17, 2022

(87) PCT Pub. No.: WO2021/250749
PCT Pub. Date: Dec. 16, 2021

(65) Prior Publication Data
US 2023/0209972 A1 Jun. 29, 2023

(51) Int. Cl.
*H10K 59/80* (2023.01)
*H10K 59/12* (2023.01)
(Continued)

(52) U.S. Cl.
CPC ..... *H10K 59/8723* (2023.02); *H10K 59/1201* (2023.02); *H10K 59/353* (2023.02); *H10K 71/135* (2023.02); *H10K 59/8731* (2023.02)

(58) Field of Classification Search
CPC ............. H10K 59/1201; H10K 59/353; H10K 59/122; H10K 59/8723; H10K 59/8731;
(Continued)

(56) References Cited

U.S. PATENT DOCUMENTS 7,038,377 B2 * 5/2006 Kobayashi ........... H10K 59/131
438/30
2003/0221614 A1 12/2003 Kang et al.
(Continued)

FOREIGN PATENT DOCUMENTS

JP 2004014513 A 1/2004
WO WO-2018167926 A1 * 9/2018 .............. G09F 9/30
(Continued)

*Primary Examiner* — Brigitte A Paterson
(74) *Attorney, Agent, or Firm* — ScienBiziP, P.C.

(57) ABSTRACT

A display device includes: a substrate, a thin film transistor layer; a display region and a frame region; a light-emitting element layer including a first electrode, a light-emitting layer, and a second electrode in this order from the thin film transistor layer side; a peripheral electrode; an edge cover configured to cover an edge of the first electrode and an edge of the peripheral electrode; a plurality of spacers provided in the display region and the frame region; and a sealing layer. The plurality of spacers includes a plurality of third spacers provided on the edge cover in the frame region. A plurality of third spacer groups including a plurality of adjacent third spacers of the plurality of third spacers is provided. Each of the plurality of third spacer groups is provided in parallel to each other and in a direction intersecting an edge of the display region.

20 Claims, 17 Drawing Sheets

(51) Int. Cl.
*H10K 59/35* (2023.01)
*H10K 71/13* (2023.01)

(58) Field of Classification Search
CPC ...... H10K 71/135; H05B 33/04; H05B 33/10; H05B 33/12; H05B 33/22; G09F 9/30
See application file for complete search history.

(56) References Cited

U.S. PATENT DOCUMENTS

| | | | |
|---|---|---|---|
| 2008/0030128 A1* | 2/2008 | Kim | H10K 59/131 |
| | | | 313/504 |
| 2019/0173042 A1* | 6/2019 | Lim | H10K 59/8723 |
| 2019/0363275 A1 | 11/2019 | Ochi et al. | |
| 2021/0257579 A1 | 8/2021 | Okabe et al. | |

FOREIGN PATENT DOCUMENTS

| | | | | |
|---|---|---|---|---|
| WO | WO-2018179308 A1 * | 10/2018 | ............. | G09F 9/301 |
| WO | WO-2019030887 A1 * | 2/2019 | ............... | G09F 9/30 |
| WO | 2020039555 A1 | 2/2020 | | |

* cited by examiner

DISPLAY DEVICE AND DISPLAY DEVICE MANUFACTURING METHOD

TECHNICAL FIELD

The disclosure relates to a display device and a display device manufacturing method.

BACKGROUND ART

In recent years, various display devices including a light-emitting element have been developed. Particularly, a display device including an organic light emitting diode (OLED) has drawn a great deal of attention because the device is capable of achieving lower power consumption, smaller thickness, higher picture quality, and the like.

For example, PTL 1 describes that a vapor deposition mask is used for manufacturing the display device including the OLED.

CITATION LIST

Patent Literature

PTL 1: JP 2004-14513 A (published on Jan. 15, 2004)

SUMMARY

Technical Problem

Unfortunately, when light-emitting layers having a plurality of types of different colors are formed by a vapor deposition method using a vapor deposition mask and a resin layer included in a sealing layer is formed by an ink-jet method, the following problems arise.

(a) of FIG. 17 and (b) of FIG. 17 are diagrams for describing problems when the light-emitting layers having a plurality of types of different colors are formed by the vapor deposition method using a vapor deposition mask VM, and a resin layer 131 included in the sealing layer is formed using the ink-jet method.

A display panel 100 illustrate in (a) of FIG. 17 includes a substrate (not illustrated), a thin film transistor layer (not illustrated) provided on the substrate, a display region DA and a frame region NDA around the display region DA, the display region DA and the frame region NDA including the substrate and the thin film transistor layer, a first electrode 122 provided in the display region DA, a peripheral electrode 122' in the same layer as the first electrode 122 provided in the frame region NDA and including a plurality of openings 122'N, and an edge cover 123 provided in the display region DA and the frame region NDA to cover an edge of the first electrode 122 and part of the peripheral electrode 122'. A plurality of spacers 133 is provided on part of the edge cover 123 in the display region DA, and a plurality of spacers 133' is provided on part of the edge cover 123 in the frame region NDA.

The spacer 133 and the spacer 133' are used for disposing a vapor deposition mask VM illustrated in (a) of FIG. 17, and thus the spacer 133 and the spacer 133' have the same height.

As illustrated in (a) of FIG. 17, a portion of the vapor deposition mask VM disposed to face the display region DA includes a large number of openings VMK, but a portion of the vapor deposition mask VM disposed to face the frame region NDA does not include the opening VMK. Thus, a weight of the portion of the vapor deposition mask VM disposed to face the frame region NDA is heavier than a weight of the portion of the vapor deposition mask VM disposed to face the display region DA. Thus, to support the vapor deposition mask VM with the spacers 133 and 133' so that deflection of such a vapor deposition mask VM does not occur, a second density obtained by dividing the number of the spacers 133' by an area of the frame region NDA is required to be larger than a first density obtained by dividing the number of the spacers 133 by an area of the display region DA.

In the display panel 100 illustrated in (a) of FIG. 17, the spacer 133 is formed in the display region DA at a relatively low density, and the spacer 133' is formed in the frame region NDA at a high density. In addition, as illustrated in (a) of FIG. 17, the edge cover 123 is provided in the frame region NDA to form a removal region 123K of the edge cover 123 for exposing the peripheral electrode 122' except for a formation region of the spacer 133'. Note that the removal region 123K of the edge cover 123 is a common electrode in the display region DA and is used to electrically connect a second electrode (not illustrated) extending from the display region DA to the frame region NDA and the peripheral electrode 122'.

A display panel 140 illustrated in (b) of FIG. 17 is a view illustrating a case where a light-emitting layer (not illustrated), a second electrode (not illustrated), and a sealing layer including the resin layer 131 are formed on the display panel 100 illustrated in (a) of FIG. 17.

The display panel 140 illustrated in (b) of FIG. 17 includes the edge cover 123, the spacer 133, and the spacer 133' formed as described above.

When the resin layer 131 is formed by the ink-jet method, the spacer 133 is formed at a relatively low density in the display region DA excluding near the edge of the display region DA close to the frame region NDA, and thus the spacer 133 does not have a large adverse effect on spread of the resin layer 131, and the resin layer 131 having a predetermined thickness can be formed.

As illustrated in (b) of FIG. 17, however, near the edge of the display region DA close to the frame region NDA and in the frame region NDA, the spacer 133' formed at a high density has a large adverse effect on the spread of the resin layer 131, and thus the resin layer 131 is formed thicker than the predetermined film thickness.

As described above, in the display panel 140 illustrated in (b) of FIG. 17, the resin layer 131 is formed thicker near the edge of the display region DA close to the frame region NDA from a central portion of the display region DA, and thus a display device including such a display panel 140 causes display unevenness in the display region DA.

An aspect of the disclosure has been made in view of the problems described above, and an object of the disclosure is to provide a display device and a display device manufacturing method achieving an improved display quality and frame narrowing by suppressing occurrence of display unevenness.

Solution to Problem

To solve the above problems, a display device of the disclosure includes
a substrate,
a thin film transistor layer provided on the substrate,
a display region and a frame region around the display region, the display region and the frame region including the substrate and the thin film transistor layer, a light-emitting element layer provided in the display region and including a first electrode, a light-emitting layer, and a second electrode in this order from the thin film transistor layer side, a peripheral electrode provided in the frame region and including a plurality of openings, an edge cover configured to cover an edge of the first electrode and an edge of the peripheral electrode, a plurality of spacers provided in the display region and the frame region, and a sealing layer provided on a side opposite to the substrate side in at least part of the frame region and in the display region and including a resin layer.

The plurality of spacers includes a plurality of first spacers provided on the edge cover in the display region and a plurality of second spacers and a plurality of third spacers provided on the edge cover in the frame region, a total height of a height of the edge cover in the frame region and a height of each of the plurality of second spacers is equal to a total height of a height of the edge cover in the display region and a height of each of the plurality of first spacers, a total height of a height of the edge cover in the frame region and a height of each of the plurality of third spacers is lower than a total height of the height of the edge cover in the frame region and the height of each of the plurality of second spacers, a first density obtained by dividing the number of the plurality of first spacers by an area of the display region is smaller than a second density obtained by dividing the number of the plurality of second spacers by an area of the frame region, a plurality of third spacer groups including a plurality of adjacent third spacers of the plurality of third spacers is provided, and each of the plurality of third spacer groups is provided in parallel to each other and in a direction intersecting an edge of the display region.

To solve the problem described above, a display device manufacturing method according to the disclosure includes forming a thin film transistor layer on a substrate, forming a first electrode in a display region and forming a peripheral electrode in a frame region around the display region, forming an edge cover to cover an edge of the first electrode and an edge of the peripheral electrode, forming a plurality of first spacers on the edge cover in the display region, forming a plurality of second spacers on the edge cover in the frame region such that a total height of a height of the edge cover in the frame region and a height of each of the plurality of second spacers is equal to a total height of a height of the edge cover in the display region and a height of each of the plurality of first spacers, and forming a plurality of third spacers on the edge cover in the frame region such that a total height of a height of the edge cover in the frame region and a height of each of the plurality of third spacers is lower than a total height of a height of the edge cover in the frame region and a height of each of the plurality of second spacers, disposing a vapor deposition mask on the plurality of first spacers and the plurality of second spacers, forming a light-emitting layer via the vapor deposition mask, forming a second electrode that is a common electrode in the display region and extends from the display region to the frame region, and forming a sealing layer on a side opposite to the substrate side in at least part of the frame region and in the display region and including a resin layer.

In the forming a plurality of first spacers, a plurality of second spacers, and a plurality of third spacers, the plurality of first spacers and the plurality of second spacers are formed such that a first density obtained by dividing the number of the plurality of first spacers by an area of the display region is smaller than a second density obtained by dividing the number of the plurality of second spacers by an area of the frame region, a plurality of third spacer groups including a plurality of adjacent third spacers of the plurality of third spacers is formed, and each of the plurality of third spacer groups is disposed in parallel to each other and in a direction intersecting an edge of the display region.

Advantageous Effects of Disclosure

An aspect of the disclosure can provide a display device and a display device manufacturing method achieving an improved display quality and frame narrowing by suppressing occurrence of display unevenness.

DESCRIPTION OF EMBODIMENTS

Embodiments of the disclosure will be described with reference to FIG. 1 to FIG. 16 as follows. Hereinafter, for convenience of explanation, components having the same functions as those described in a specific embodiment are appended with the same reference signs, and descriptions thereof may be omitted.

First Embodiment

Figure 1:
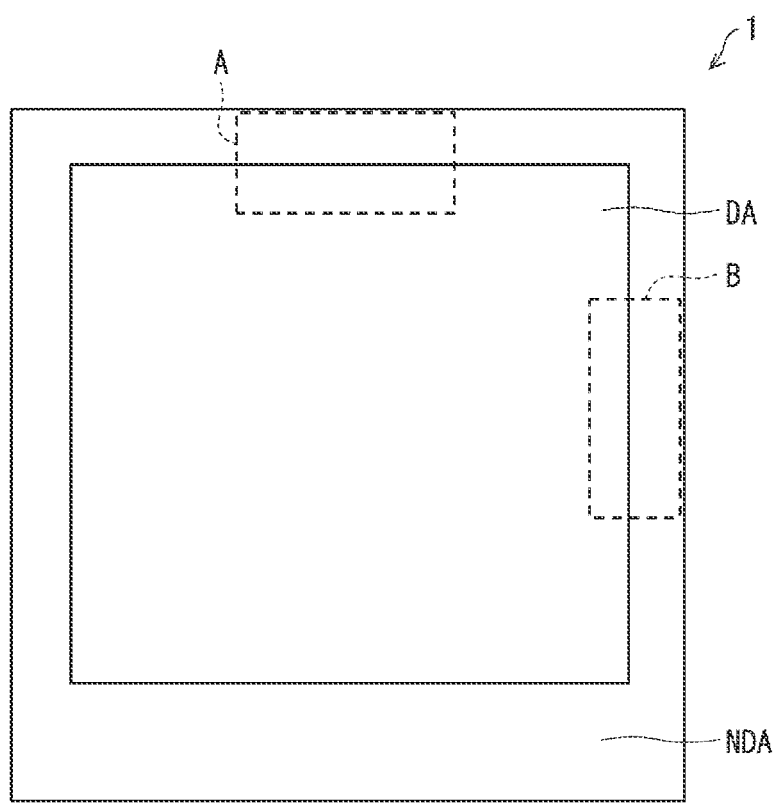
FIG. 1 is a plan view illustrating a display panel provided in a display device according to a first embodiment.

FIG. 1 is a plan view illustrating a display panel 1 provided in a display device 40 according to a first embodiment.

Figure 2:
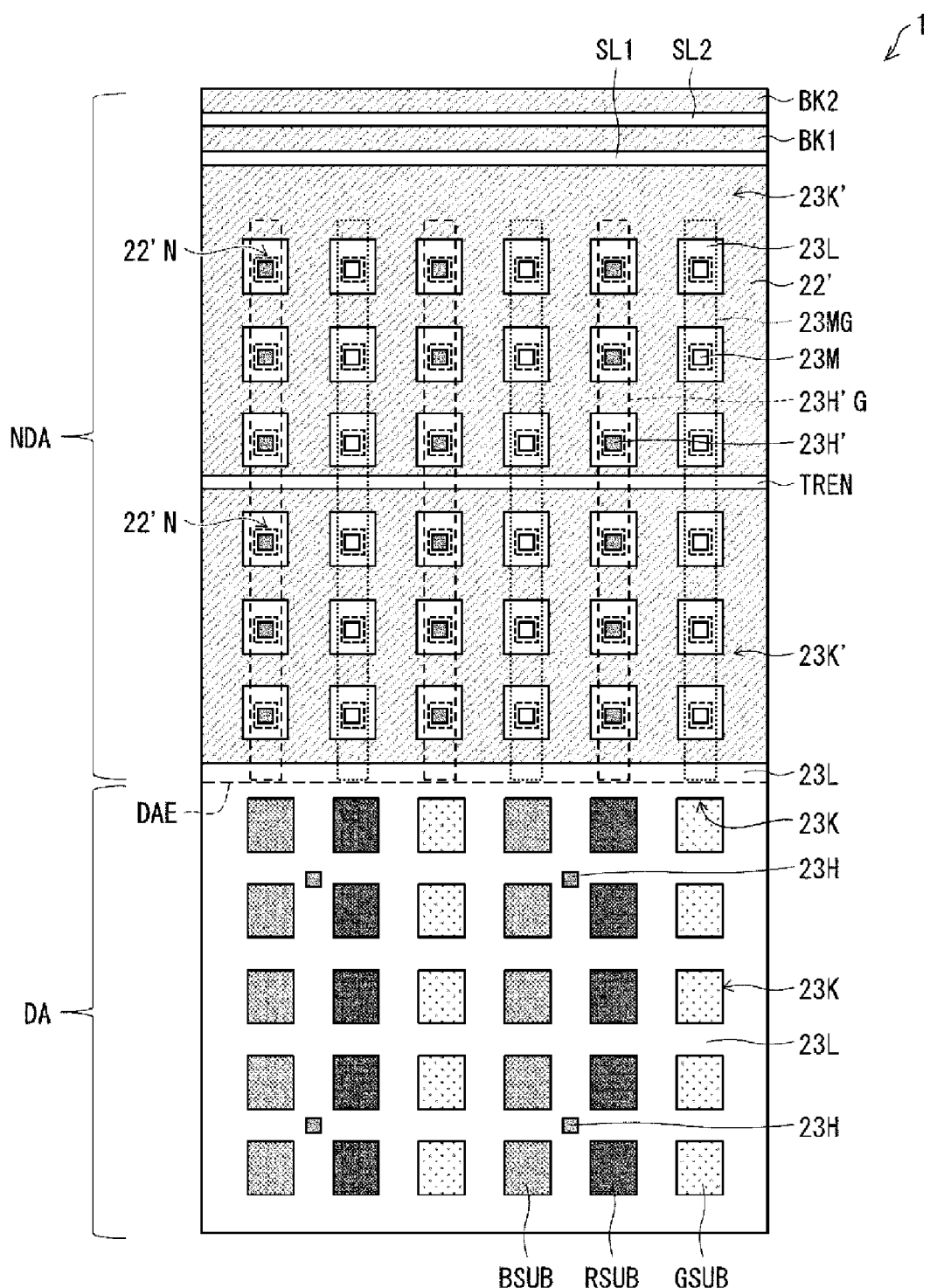
FIG. 2 is a partially enlarged view of a portion A illustrated in FIG. 1.
Figure 3:
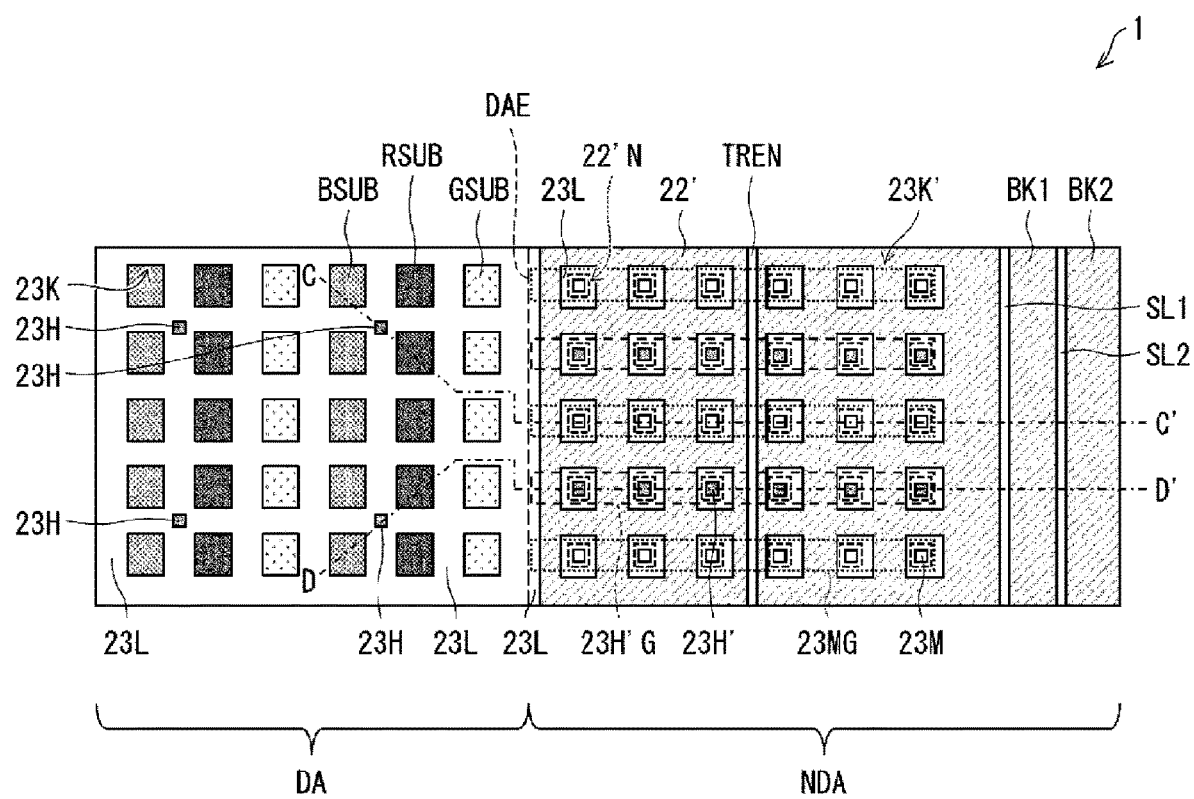
FIG. 3 is a partially enlarged view of a portion B illustrated in FIG. 1.

FIG. 2 is a partially enlarged view of a portion A illustrated in FIG. 1, and FIG. 3 is a partially enlarged view of a portion B illustrated in FIG. 1.

The display panel 1 illustrated in FIG. 1 to FIG. 3 includes a substrate 10 (see FIG. 4 to FIG. 11), a thin film transistor layer 4 (see FIG. 4 to FIG. 11) provided on the substrate 10, a display region DA including the substrate 10 and the thin film transistor layer 4 and including a red subpixel RSUB, a green subpixel GSUB, and a blue subpixel BSUB, and a frame region NDA around the display region DA. In the present embodiment, a case will be described as an example, in which three types of different subpixels, that is, a red subpixel RSUB, a green subpixel GSUB, and a blue subpixel BSUB are provided in the display region DA, and these three subpixels form one pixel, but the present embodiment is not limited to the case, and subpixels of other colors may be further included to form one pixel in addition to these three subpixels.

Figure 4:
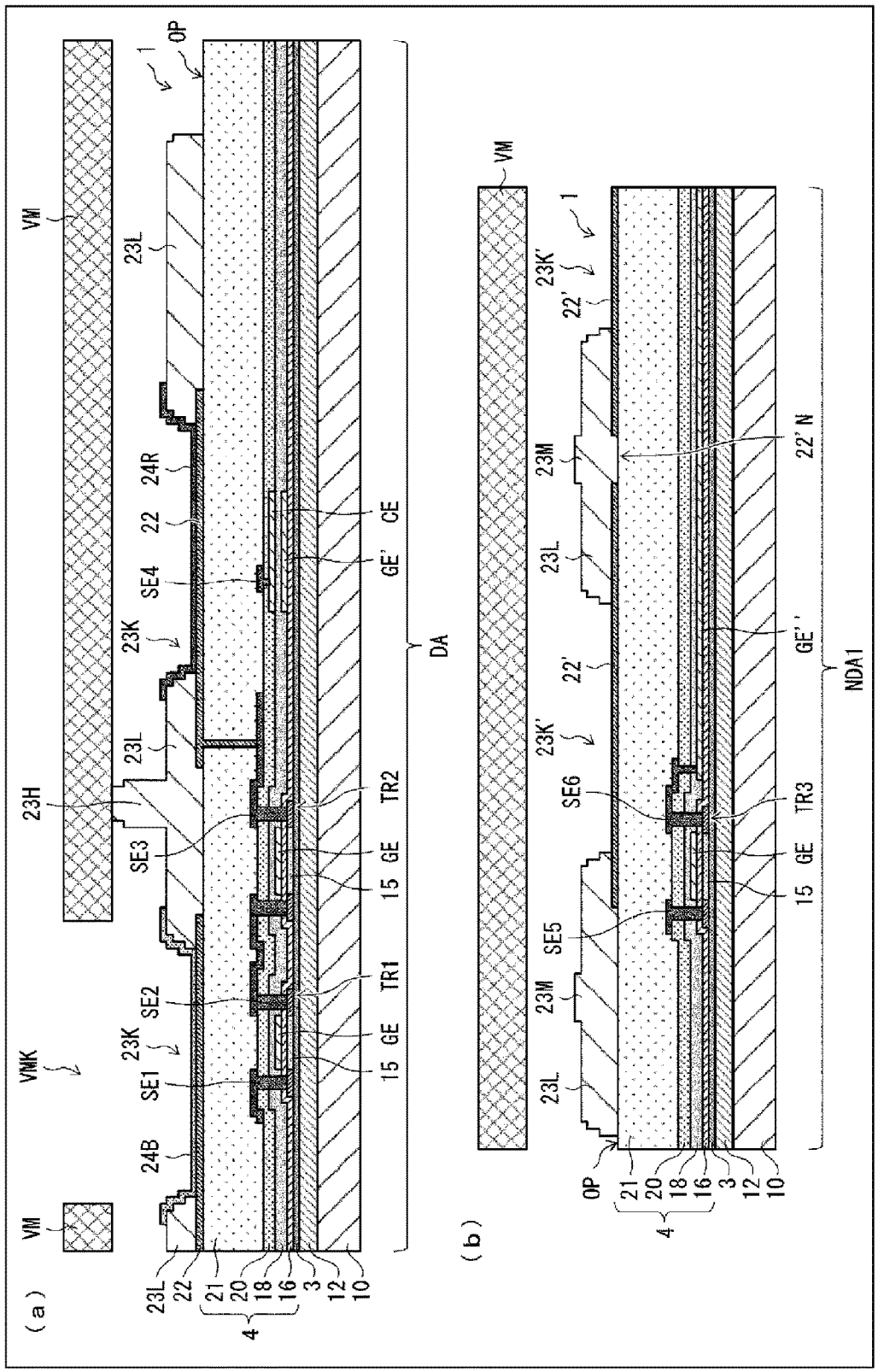
FIG. 4(a) is a cross-sectional view taken along line C-C' illustrated in FIG. 3 and is a view illustrating a display region of the display panel.
FIG. 4(b) is a cross-sectional view taken along line C-C' illustrated in FIG. 3 and is a view illustrating a frame region (first frame region) closest to the display region of the display panel.
Figure 6:
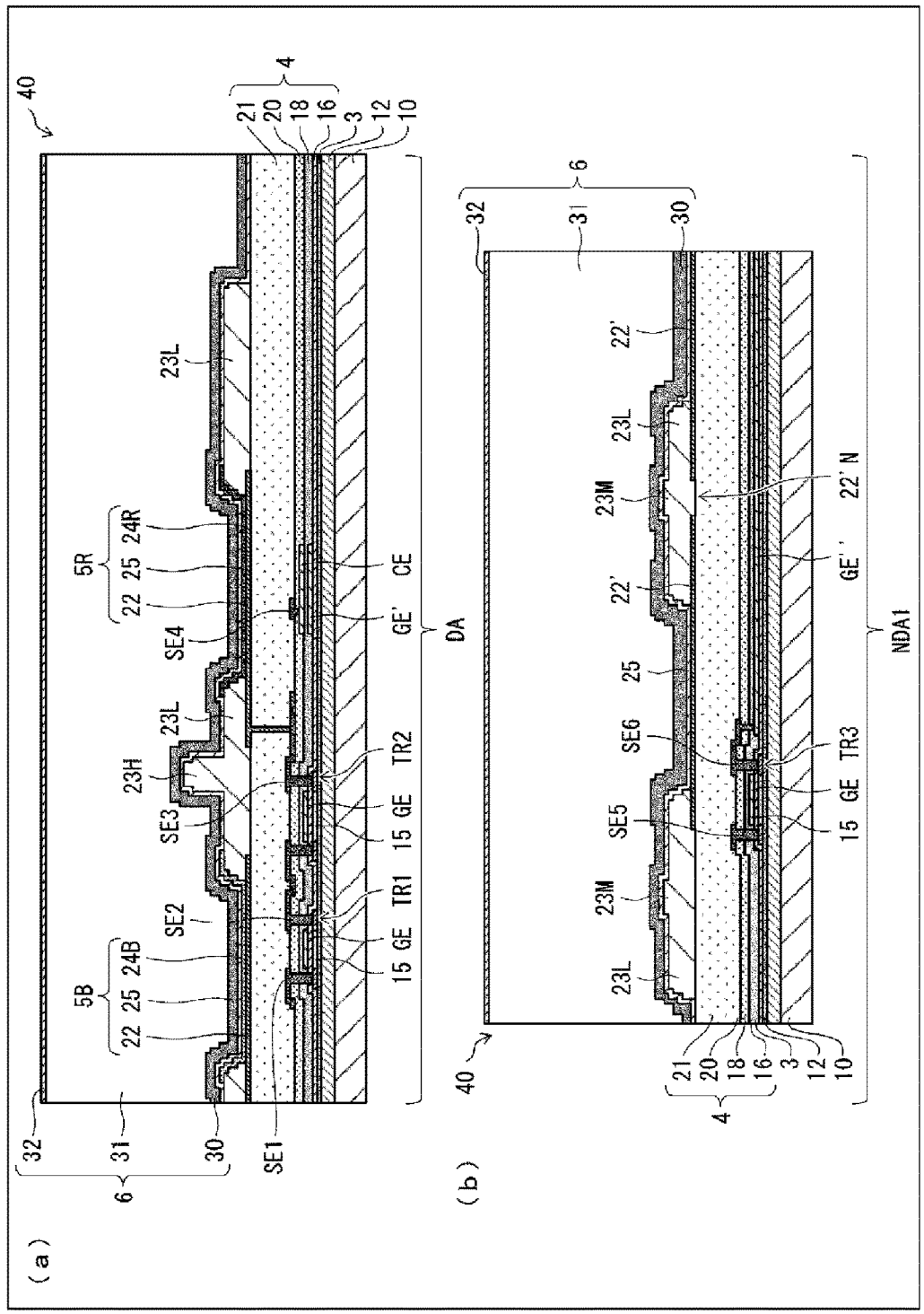
FIG. 6(a) is a view illustrating a display region of the display device of the first embodiment corresponding to the cross-section of the display panel illustrated in (a) of FIG. 4.
FIG. 6(b) is a view illustrating the frame region (first frame region) closest to the display region of the display device of the first embodiment corresponding to the cross-section of the display panel illustrated in (b) of FIG. 4.
Figure 8:
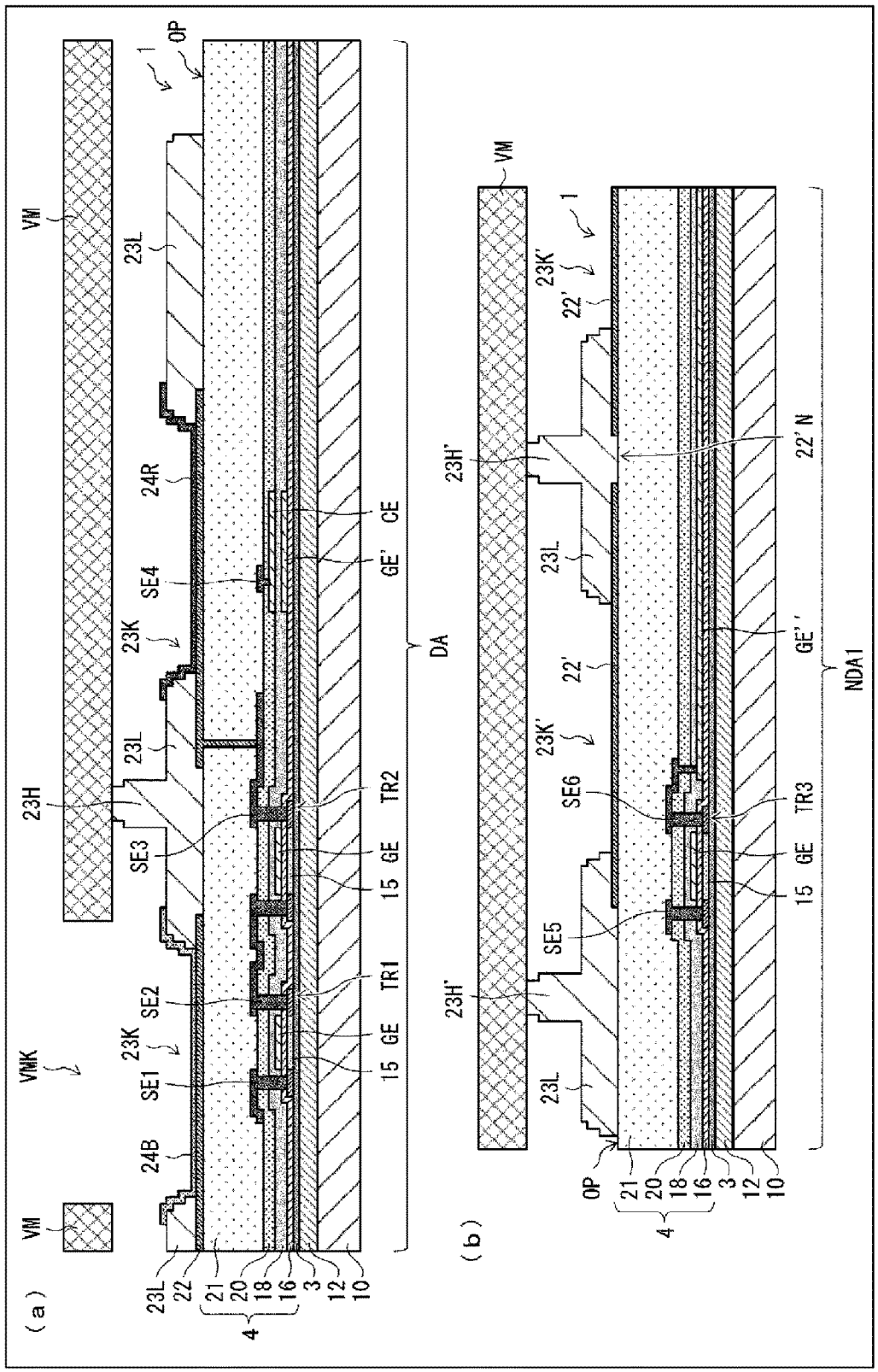
FIG. 8(a) is a cross-sectional view taken along line D-D' illustrated in FIG. 3 and is a view illustrating a display region of the display panel.
FIG. 8(b) is a cross-sectional view taken along line D-D' illustrated in FIG. 3 and is a view illustrating a frame region (first frame region) closest to the display region of the display panel.
Figure 10:
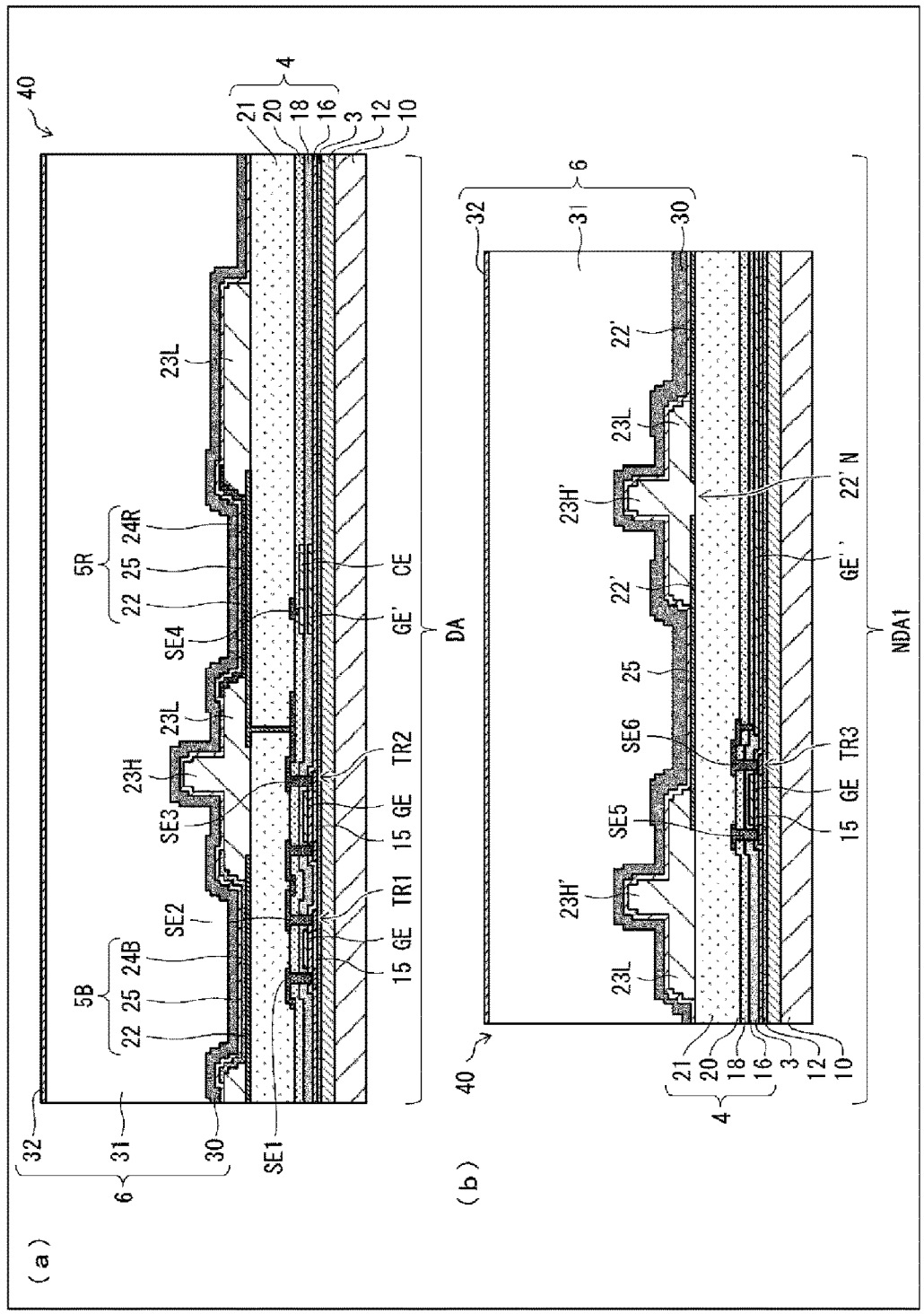
FIG. 10(*a*) is a view illustrating a display region of the display device of the first embodiment corresponding to the cross-section of the display panel illustrated in (a) of FIG. 8, and FIG. 10(*b*) is a view illustrating the frame region (first frame region) closest to the display region of the display device of the first embodiment corresponding to the cross-section of the display panel illustrated in (b) of FIG. 8.

As illustrated in FIG. 2 and FIG. 3, one peripheral electrode 22' including a plurality of openings 22' N is provided in the frame region NDA of the display panel 1, and a plurality of first electrodes 22 (not illustrated) (see (a) of FIG. 4, (a) of FIG. 6, (a) of FIG. 8, and (a) of FIG. 10) is provided in an island shape in the same layer as the peripheral electrode 22' in the display region DA of the display panel 1. Note that, when the first electrode 22 is used as an anode, a second electrode 25 described later is used as a cathode.

In other words, one peripheral electrode 22' provided in the frame region NDA of the display panel 1 and including the plurality of openings 22'N is provided to surround the display region DA. Note that the first electrode 22 is provided in the same layer as the peripheral electrode 22' means that the first electrode 22 and the peripheral electrode 22' are layers provided in the same step using the same material.

In the present embodiment, a case will be described as an example in which the peripheral electrode 22' and the first electrode 22 are formed of the same material, but the present embodiment is not limited to the case, and the peripheral electrode 22' and the first electrode 22 may be formed by different steps using different materials.

In the present embodiment, as illustrated in FIG. 2 and FIG. 3, an edge cover 23L is provided in the display region DA and the frame region NDA of the display panel 1. In the display region DA, the edge cover 23L is provided to cover an edge of each of the plurality of first electrodes 22 having the island shape (see (a) of FIG. 4, (a) of FIG. 6, (a) of FIG. 8, and (a) of FIG. 10), and each of the plurality of first electrode 22 is exposed from the edge cover 23L by an opening 23K of the edge cover 23L, and the red subpixel RSUB, the green subpixel GSUB, and the blue subpixel BSUB are formed on each of the exposed portions. On the other hand, in the frame region NDA, the edge cover 23L is provided to cover the opening 22'N of the peripheral electrode 22' and an edge of the peripheral electrode 22', and a removal region 23K' of the edge cover 23L is provided to expose the peripheral electrode 22'.

As illustrated in FIG. 2 and FIG. 3, a plurality of first spacers 23H is provided on the edge cover 23L in the display region DA, and a plurality of second spacers 23H' and a plurality of third spacers 23M are provided on the edge cover 23L in the frame region NDA. A total height of a height of the edge cover 23L in the frame region NDA and a height of the second spacer 23H' is equal to a total height of a height of the edge cover 23L in the display region DA and a height of the first spacer 23H, and a total height of the height of the edge cover 23L in the frame region NDA and a height of the third spacer 23M is lower than a total height of the height of the edge cover 23L in the frame region NDA and the height of the second spacer 23H'. Note that in the present embodiment, the height of the edge cover 23L in the display region DA and the height of the edge cover 23L in the frame region NDA are the same. The first spacer 23H and the second spacer 23H' are used for disposing the vapor deposition mask VM as described below, and thus the first spacer 23H and the second spacer 23H' have the same height.

Figure 5:
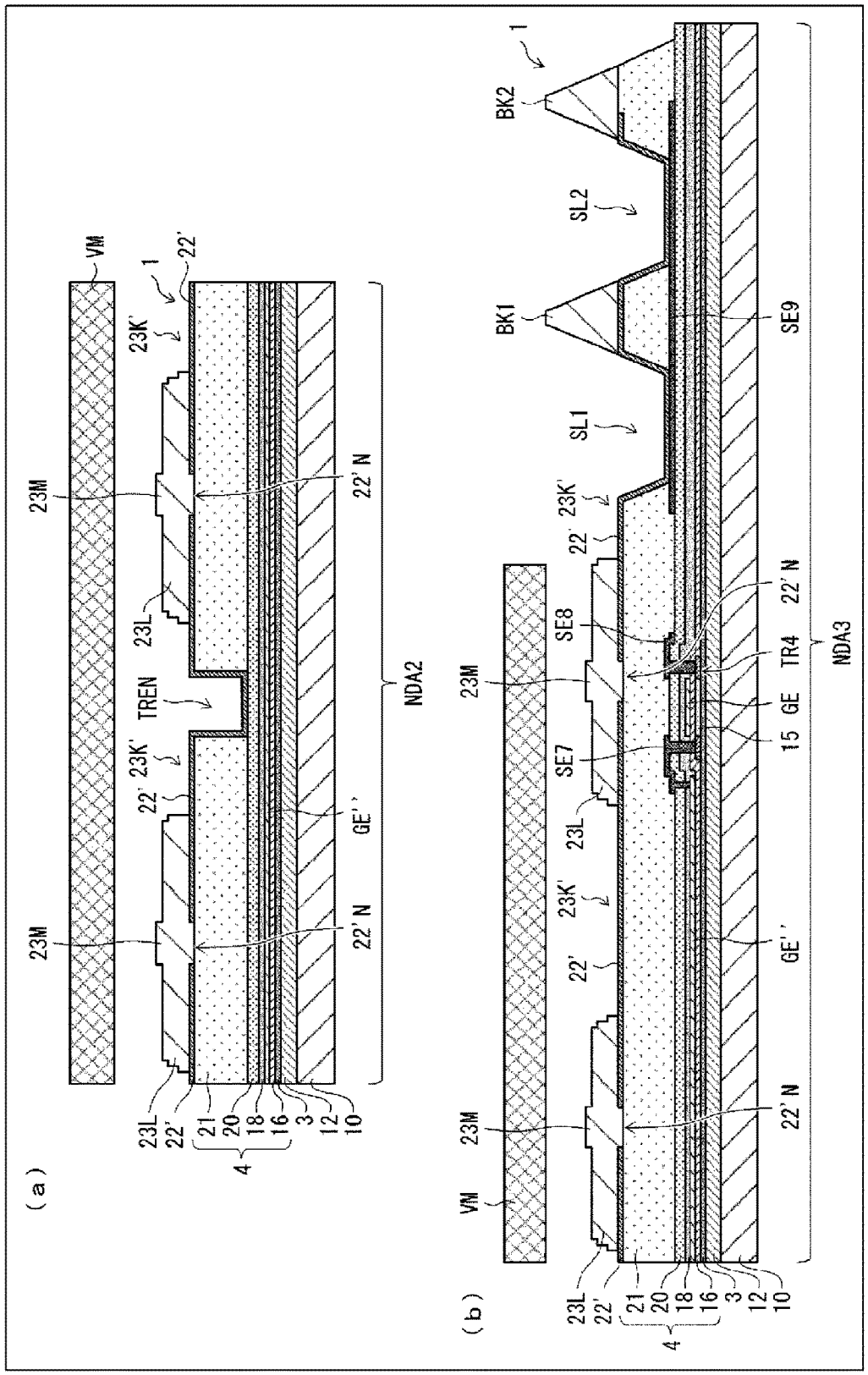
FIG. 5(a) is a cross-sectional view taken along line C-C' illustrated in FIG. 3 and is a view illustrating a frame region (second frame region) of the display panel.
FIG. 5(b) is a cross-sectional view taken along line C-C' illustrated in FIG. 3 and is a view illustrating a frame region (third frame region) farthest from the display region of the display panel.
Figure 9:
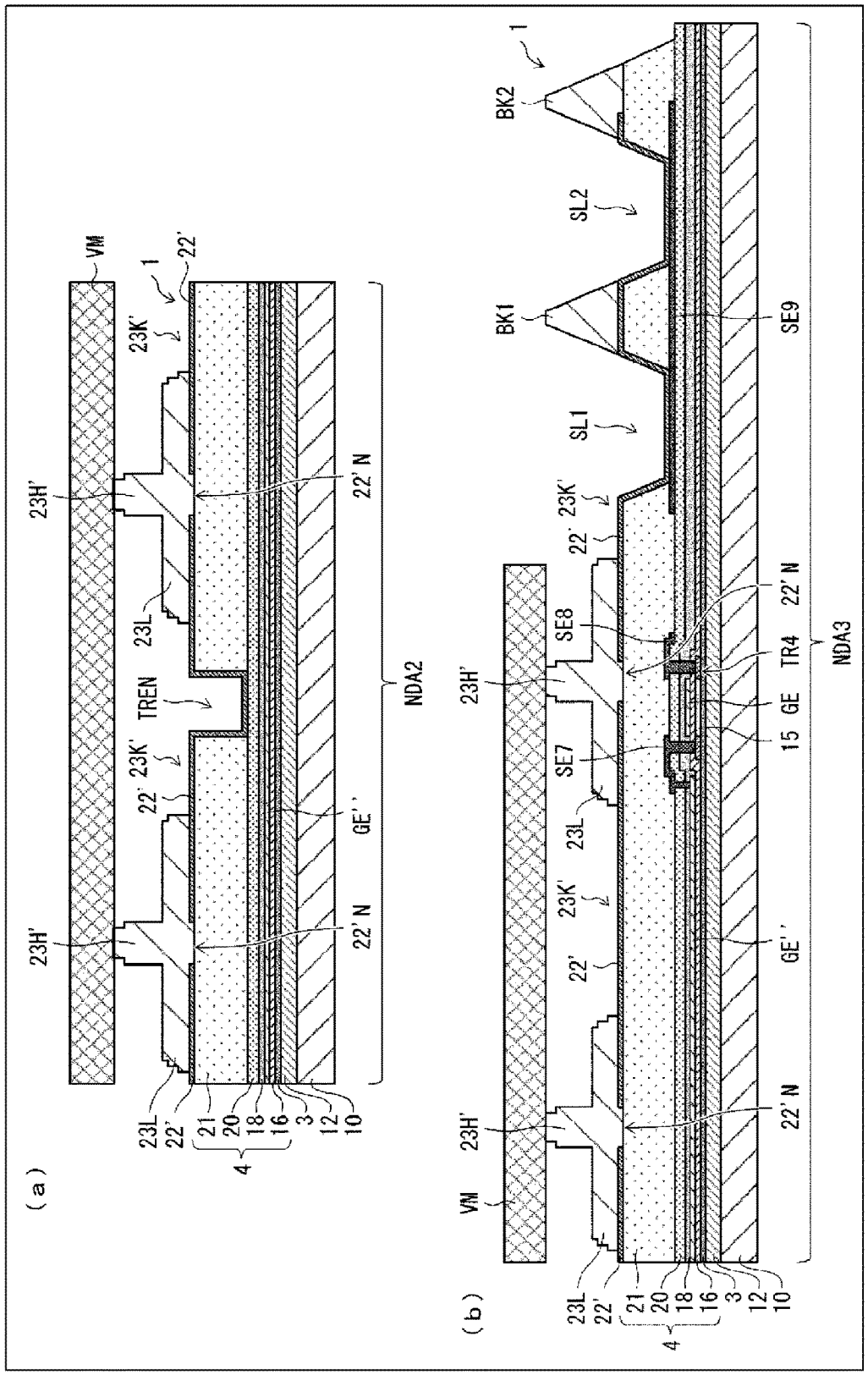
FIG. 9(*a*) is a cross-sectional view taken along line D-D' illustrated in FIG. 3 and is a view illustrating a frame region (second frame region) of the display panel, and FIG. 9(*b*) is a cross-sectional view taken along line D-D' illustrated in FIG. 3 and is a view illustrating a frame region (third frame region) farthest from the display region of the display panel.

A portion of the vapor deposition mask VM disposed to face the display region DA (see (a) of FIG. 4 and (a) of FIG. 8) includes a large number of openings VMK, but a portion of the vapor deposition mask VM disposed to face the frame region NDA (see (b) of FIG. 4, (a) of FIG. 5 and (b) of FIG. 5, (b) of FIG. 8, (a) of FIG. 9 and (b) of FIG. 9) does not include the opening VMK, and thus a weight of the portion of the vapor deposition mask VM disposed to face the frame region NDA is heavier than a weight of the portion of the vapor deposition mask VM disposed to face the display region DA. Thus, to support the vapor deposition mask VM with the first spacer 23H and the second spacer 23H' so that deflection of such a vapor deposition mask VM does not occur, a second density obtained by dividing the number of the second spacers 23' by the area of the frame region NDA is required to be larger than a first density obtained by dividing the number of the first spacers 23 by the area of the display region DA. Thus, as illustrated in FIG. 2 and FIG. 3, in the display panel 1, the first density is smaller than the second density.

As illustrated in FIG. 2 and FIG. 3, provided is a plurality of third spacer groups 23MG including a plurality of adjacent third spacers 23M of the plurality of third spacers 23M provided in the frame region NDA. Each of the plurality of third spacer groups 23MG is provided in parallel to each other and in a direction intersecting an edge DAE of the display region DA.

As illustrated in FIG. 2 and FIG. 3, provided is a plurality of second spacer groups 23H'G including a plurality of adjacent second spacers 23H' of the plurality of second spacers 23H' provided in the frame region NDA. In the present embodiment, as illustrated in FIG. 2 and FIG. 3, each of the plurality of third spacer groups 23MG and each of the plurality of second spacer groups 23H'G are provided in parallel to each other, but the present embodiment is not limited to the configuration, and if only each of the plurality of third spacer groups 23MG is provided in parallel to each other and in a direction intersecting the edge DAE of the display region DA, each of the plurality of second spacer groups 23H'G may be formed in non-parallel to each of the plurality of third spacer groups 23MG within a range not intersecting each of the plurality of third spacer groups 23MG.

In the present embodiment, as illustrated in FIG. 2 and FIG. 3,
each of the plurality of second spacer groups 23H'G and each of the plurality of third spacer groups 23MG are alternately provided in a direction along the edge DAE of the display region DA (the left-right direction in the case of FIG. 2,
the up-down direction in the case of FIG. 3), but the present embodiment is not limited to the configuration. For example, in the direction along the edge DAE of the display region DA, each of the plurality of second spacer groups 23H'G may be partially continuously formed, and each of the plurality of third spacer groups 23MG may be partially continuously formed.

In the present embodiment, as illustrated in FIG. 2 and FIG. 3, a trench (groove) TREN extending along the edge DAE of the display region DA is provided in the frame region NDA of the display panel 1. The trench TREN is a groove formed in a flattening film 21 (see (a) of FIG. 5 and (a) of FIG. 9) included in the thin film transistor layer 4 to expose part of a wiring line formed in the same layer as the source electrode and the drain electrode of the thin film transistor. As illustrated in FIG. 2, FIG. 3, (a) of FIG. 7, and (a) of FIG. 9, each of the plurality of second spacer groups 23H'G and each of the plurality of third spacer groups 23MG intersect the trench TREN.

In the present embodiment, as illustrated in FIG. 2 and FIG. 3, a first slit SL1 and a second slit SL2 extending along the edge DAE of the display region DA are provided in the frame region NDA distal to the plurality of second spacers 23H' and the plurality of third spacers 23M from the display region DA. The first slit SL1 is provided closer to the display region DA than the second slit SL2.

Note that the trench TREN serves to prevent moisture intrusion from the periphery by forming a slit in the flattening film 21. A bottom of the trench TREN is not a wiring line such as an electrode and is an inorganic insulating film 20. In the first slit SL1 and the second slit SL2 outside the trench TREN, the peripheral electrode 22' is connected to a layer SE9 forming the source electrode, the drain electrode, and the wiring line and are drawn to the outside (see (a) of FIG. 5 and (b) of FIG. 5, and (a) of FIG. 9 and (b) of FIG. 9.

In the present embodiment, as illustrated in FIG. 2 and FIG. 3, a first bank BK1 is provided along the edge DAE of the display region DA between the first slit SL1 and the second slit SL2, and a second bank BK2 is provided along the edge DAE of the display region DA farther from the display region DA than the second slit SL2.

Figure 7:
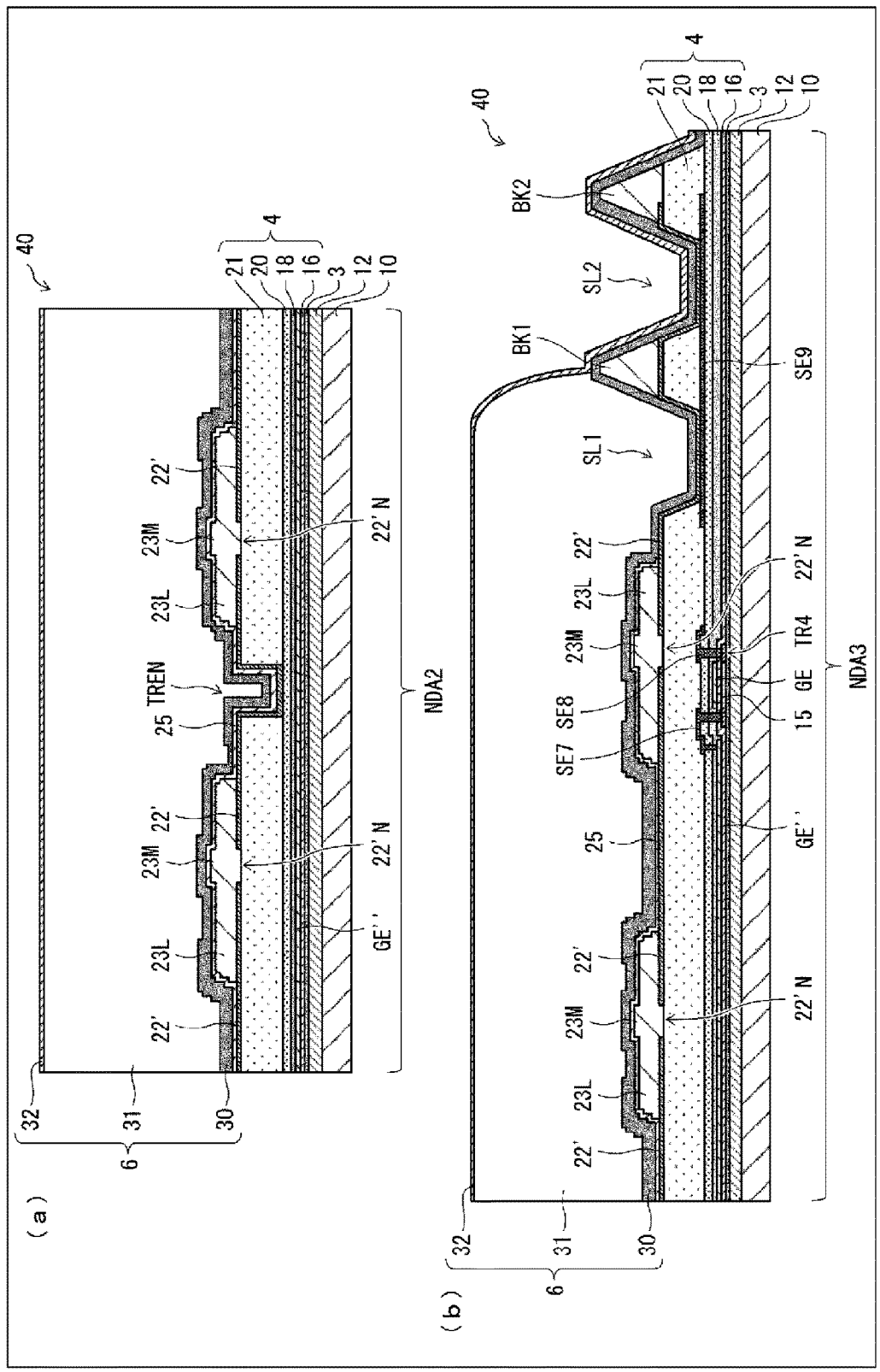
FIG. 7(a) is a view illustrating the frame region (second frame region) of the display device of the first embodiment corresponding to the cross-section of the display panel illustrated in (a) of FIG. 5.
FIG. 7(b) is a view illustrating the frame region (third frame region) farthest from the display region of the display device of the first embodiment corresponding to the cross-section of the display panel illustrated in (b) of FIG. 5.
Figure 11:
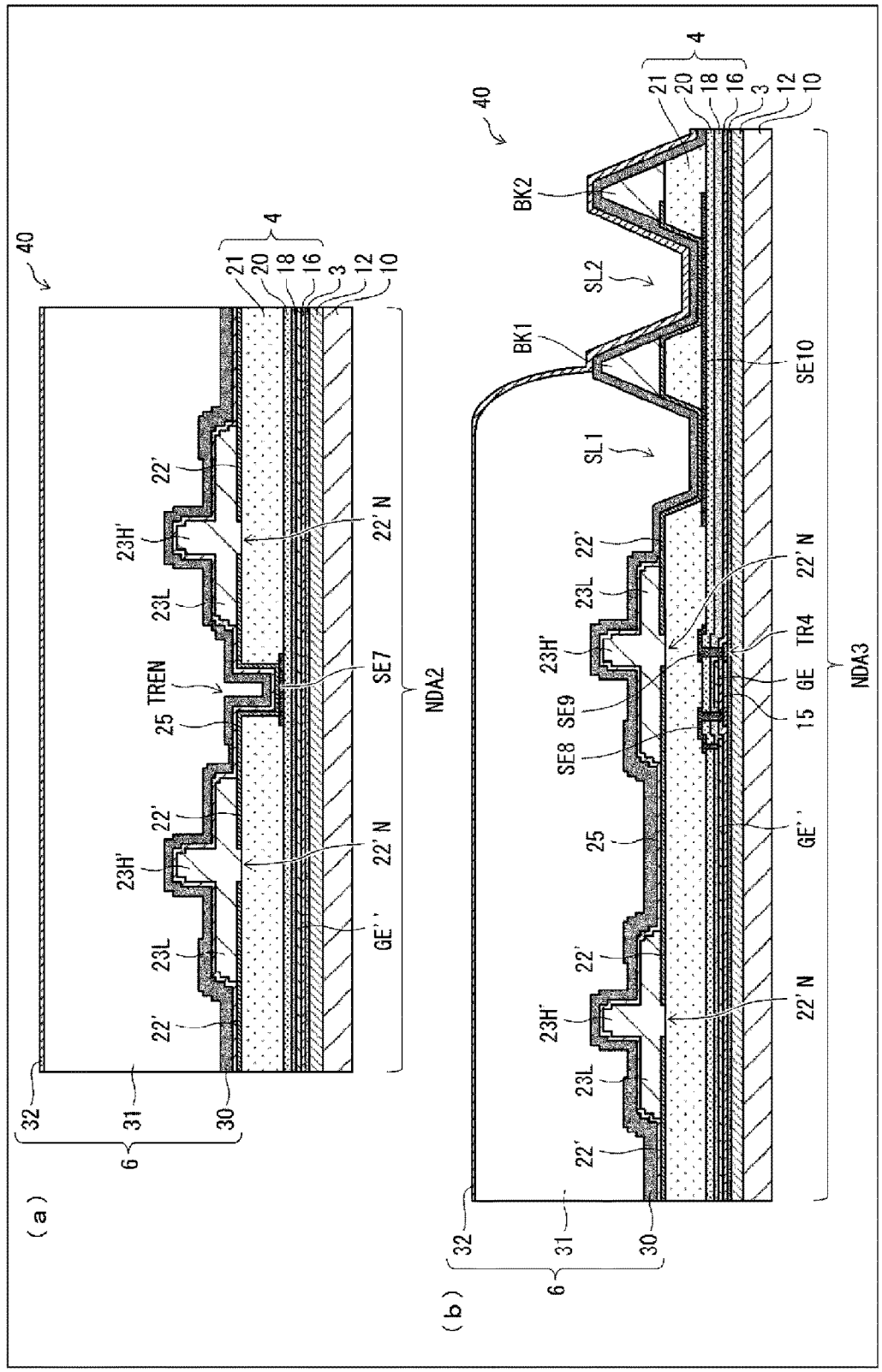
FIG. 11(*a*) is a view illustrating the frame region (second frame region) of the display device of the first embodiment corresponding to the cross-section of the display panel illustrated in (a) of FIG. 9, and FIG. 11(*b*) is a view illustrating the frame region (third frame region) farthest from the display region of the display device of the first embodiment corresponding to the cross-section of the display panel illustrated in (b) of FIG. 9.

By providing the first slit SL1 and the second slit SL2, a wider contact between the wiring line and the peripheral electrode 22' formed in the same layer as the source electrode and the drain electrode of the thin film transistor can be ensured (see (b) of FIG. 7 and (b) of FIG. 11). The present the configuration is not limited to the configuration, and at least one of the first slit SL1 and the second slit SL2 need not be provided as long as the contact between the wiring line formed in the same layer as the source electrode and the drain electrode of the thin film transistor and the peripheral electrodes 22' can be sufficiently secured in other portions.

By providing the first bank BK1 and the second bank BK2, spread of an organic sealing layer (resin layer) 31 (see (b) of FIG. 7 and (b) of FIG. 11) in the sealing layer 6 described later can be controlled relatively easily in a step of forming the organic sealing layer (resin layer) 31. The present embodiment is not limited to the configuration, and at least one of the first bank BK1 and the second bank BK2 need not be provided. Three or more banks may be provided.

(a) of FIG. 4 is a cross-sectional view taken along line C-C' illustrated in FIG. 3 and is a view illustrating the display region DA of the display panel 1, and (b) of FIG. 4 is a cross-sectional view taken along line C-C' illustrated in FIG. 3 and is a view illustrating a frame region NDA (first frame region NDA1) closest to the display region DA of the display panel.

(a) of FIG. 5 is a cross-sectional view taken along line C-C' illustrated in FIG. 3 and is a view illustrating a frame region NDA (second frame region NDA2) of the display panel 1, and (b) of FIG. 5 is a cross-sectional view taken along line C-C' illustrated in FIG. 3 and is a view illustrating a frame region NDA (third frame region NDA3) farthest from the display region DA of the display panel 1.

As illustrated in (a) of FIG. 4 and (b) of FIG. 4, and (a) of FIG. 5 and (b) of FIG. 5, the display panel 1 includes the substrate 10, a resin film 12, a barrier layer 3, the thin film transistor layer 4, the plurality of first electrodes 22 and the peripheral electrodes 22' formed in the same layer, and the edge cover 23L, the first spacer 23H, the second spacer 23H', and the third spacer 23M formed in the same layer in this order.

In the present embodiment, a case will be described in which the edge cover 23L, the first spacer 23H, the second spacer 23H', and the third spacer 23M are formed by one step using the same material, but the present embodiment is not limited to the case, and the edge cover 23L, the first spacer 23H, the second spacer 23H', and the third spacer 23M may be formed by different steps using different materials.

Examples of the substrate 10 may include a substrate having heat resistance that is resistant to process temperatures in subsequent steps for forming various films, and for example, a glass substrate or the like can be used.

Examples of the material of the resin film 12 may include a polyimide resin, an epoxy resin, and a polyamide resin.

The barrier layer 3 is a layer for preventing moisture or impurities from reaching transistors TR1, TR2, TR3, TR4 . . . and light-emitting element layers 5R, 5B . . . and may be constituted by, for example, a silicon oxide film, a silicon nitride film or a silicon oxynitride film formed by CVD, or a layered film of these films (see FIG. 10).

The transistors TR1, TR2, TR3, TR4 . . . and a capacitance element are provided as an upper layer overlying the barrier layer 3. The thin film transistor layer 4 including the transistors TR1, TR2, TR3, TR4 . . . and the capacitance element includes a semiconductor film 15, an inorganic insulating film (gate insulating film) 16 as an upper layer overlying the semiconductor film 15, a gate electrode GE, a capacitance electrode GE', and a wiring line GE" as an upper layer overlying the inorganic insulating film 16, an inorganic insulating film (first insulating film) 18 as an upper layer overlying the gate electrode GE, the capacitance electrode GE', and the wiring line GE", a counter electrode CE as an upper layer overlying the inorganic insulating film 18, an inorganic insulating film (second insulating film) 20 as an upper layer overlying the counter electrode CE, layers SE1 to SE9 forming a source electrode, a drain electrode, and a wiring line as an upper layer overlying the inorganic insulating film 20, and a flattening film (interlayer insulating film) 21 as an upper layer overlying the layers SE1 to SE9 forming the source electrode, the drain electrode, and the wiring line.

Note that the capacitance element includes the counter electrode CE of the capacitance element formed directly above the inorganic insulating film 18, the inorganic insulating film 18, and the capacitance electrode GE' formed directly below the inorganic insulating film 18 to overlap the counter electrode CE of the capacitance element in the same layer as the layer forming the gate electrode GE.

The transistors (thin film transistors (TFT)) TR1, TR2, TR3, TR4 . . . are formed to include the semiconductor film 15, the inorganic insulating film 16, the gate electrode GE, the inorganic insulating film 18, the inorganic insulating film 20, the source electrode, and the drain electrode.

The semiconductor film 15 is formed of low-temperature polysilicon (LTPS) or an oxide semiconductor, for example.

The layers SE1 to SE9 forming the source electrode, the drain electrode, and the wiring line, the gate electrode GE, the capacitance electrode GE, the wiring line GE", and the counter electrode CE may be formed of a single layer film or a layered film of metal, the metal including at least one of aluminum (Al), tungsten (W), molybdenum (Mo), tantalum (Ta), chromium (Cr), titanium (Ti), copper (Cu), and silver (Ag) for example.

The inorganic insulating films 16, 18, and 20 may be formed of, for example, a silicon oxide (SiOx) film, a silicon nitride (SiNx) film, or a silicon oxynitride film, or of a layered film of these, formed by CVD.

The flattening film 21 may be formed of, for example, a coatable organic material such as a polyimide resin or an acrylic resin and is preferably formed of a photosensitive organic material.

As the first electrode 22 and the peripheral electrode 22', silver (Ag) or aluminum (Al) or the like may be used, for example, and a layered body may be used in which a first metal oxide layer having conductivity, a metal layer that reflects visible light, and a second metal oxide layer that transmits visible light and has conductivity are layered in this order. The first metal oxide layer and the second metal oxide layer may be a metal oxide layer selected from indium tin oxide (ITO) and Indium Zinc Oxide (IZO), and the metal layer may be silver (Ag) or aluminum (Al).

The edge cover 23L, the first spacer 23H, the second spacer 23H', and the third spacer 23M may be formed of, for example, a coatable photosensitive organic material such as a polyimide resin or an acrylic resin.

(a) of FIG. 4 and (b) of FIG. 4, and (a) of FIG. 5 and (b) of FIG. 5 illustrate a state in which a blue light-emitting layer 24B is deposited on the display panel 1 using the vapor deposition mask VM having a large number of openings VMK for forming a blue light-emitting layer to depositing the blue light-emitting layer 24B at a predetermined position in the display panel 1. Note that on the display panel 1 illustrated in (a) of FIG. 4 and (b) of FIG. 4, and (a) of FIG. 5 and (b) of FIG. 5, a red light-emitting layer 24R and a green light-emitting layer (not illustrated) have been already deposited at predetermined positions using a vapor deposition mask for forming the red light-emitting layer and a vapor deposition mask for forming the green light-emitting layer.

As illustrated in (b) of FIG. 4, and (a) of FIG. 5 and (b) of FIG. 5, the opening 22'N of the peripheral electrode 22' and the third spacer 23M preferably overlap each other. As described above, since the peripheral electrode 22' is provided as one electrode to surround the display region DA, when the plurality of openings 22'N is not provided in the peripheral electrode 22', the flattening film 21 as a lower layer is a resin layer, and thus the flattening film 21 absorbs water due to retention during manufacturing, water washing, or the like, and the moisture absorbed by the flattening film 21 cannot be discharged through the plurality of openings 22'N of the peripheral electrodes 22', the plurality of openings 22'N serving as gas vent holes, thus causing deterioration of the light-emitting element layers 5R, 5B, . . . provided in the display panel 1. Each layer provided in the light-emitting element layers 5R, 5B . . . is a material very weak to moisture. Thus, in the present embodiment, the peripheral electrode 22' is provided with a large number of openings 22'N for allowing a gas component (moisture) to pass through from the flattening film 21. The edge cover 23L formed of an organic material and the third spacer 23M formed of an organic material are preferably provided on the plurality of openings 22'N.

In the present embodiment, as illustrated in (b) of FIG. 4, and (a) of FIG. 5 and (b) of FIG. 5, the peripheral electrode 22' contacts the flattening film 21 included in the thin film transistor layer 4, but the present embodiment is not limited to the configuration.

(a) of FIG. 8 is a cross-sectional view taken along line D-D' illustrated in FIG. 3 and is a view illustrating the display region DA of the display panel 1, and (b) of FIG. 8 is a cross-sectional view taken along line D-D' illustrated in FIG. 3 and is a view illustrating a frame region NDA (first frame region NDA1) closest to the display region DA of the display panel.

(a) of FIG. 9 is a cross-sectional view taken along line D-D' illustrated in FIG. 3 and is a view illustrating a frame region NDA (second frame region NDA2) of the display panel 1, and (b) of FIG. 9 is a cross-sectional view taken along line D-D' illustrated in FIG. 3 and is a view illustrating a frame region NDA (third frame region NDA3) farthest from the display region DA of the display panel 1.

(b) of FIG. 8, and (a) of FIG. 9 and (b) of FIG. 9 are views illustrating part of the display panel 1 including the plurality of second spacer groups 23H'G including the plurality of second spacers 23H' adjacent to each other in the frame regions NDA (the first frame region NDA1 to the third frame region NDA3). As illustrated in the drawings, each of the plurality of second spacers 23H' contacts the vapor deposition mask VM, and thus the deflection of the vapor deposition mask VM can be suppressed by the plurality of second spacers 23H'.

On the other hand, (b) of FIG. 4, and (a) of FIG. 5 and (b) of FIG. 5 are views illustrating part of the display panel 1 including the plurality of third spacer group 23MG including the plurality of third spacers 23M adjacent to each other in the frame regions NDA (the first frame region NDA1 to the third frame region NDA3). As illustrated in the drawings, since a height of each of the plurality of third spacers 23M is lower than the height of the second spacer 23H', the plurality of third spacer groups 23MG including the plurality of third spacers 23M adjacent to each other serves as passages for spreading an organic sealing layer 31 described later formed in the display region DA to the frame region NDA when the organic sealing layer 31 included in the sealing layer 6 is formed. Thus, according to the plurality of third spacer groups 23MG, it is possible to suppress the organic sealing layer 31 from being formed thick near the edge of the display region DA close to the frame region NDA from the central portion of the display region DA.

Note that (a) of FIG. 4 and (a) of FIG. 8 are views illustrating part of the display panel 1 including the first spacer 23H provided in the display region DA. As illustrated in FIG. 2 and FIG. 3, since the first density obtained by dividing the number of the first spacers 23H by the area of the display region DA is significantly smaller than the second density obtained by dividing the number of the second spacers 23H' by the area of the frame region NDA, the first spacer 23H does not adversely affect the spread of the organic sealing layer 31 in the central portion of the display region DA.

As illustrated in (b) of FIG. 8, and (a) of FIG. 9 and (b) of FIG. 9, the opening 22'N of the peripheral electrode 22' and the second spacer 23H' preferably overlap each other. As described above, since the peripheral electrode 22' is provided as one electrode to surround the display region DA, when the plurality of openings 22'N is not provided in the peripheral electrode 22', the flattening film 21 as a lower layer is a resin layer, and thus the flattening film 21 absorbs water due to retention during manufacturing, water washing, or the like, and the moisture absorbed by the flattening film 21 cannot be discharged through the plurality of openings 22'N of the peripheral electrodes 22', the plurality of openings 22'N serving as gas vent holes, thus causing deterioration of the light-emitting element layers 5R, 5B, . . . provided in the display panel 1. Each layer provided in the light-emitting element layers 5R, 5B . . . is a material very weak to moisture. Thus, in the present embodiment, the peripheral electrode 22' is provided with a large number of openings 22'N for allowing a gas component (moisture) to pass through from the flattening film 21. The edge cover 23L formed of an organic material and the second spacer 23H' formed of an organic material are preferably provided on the plurality of openings 22'N.

As illustrated in (a) of FIG. 4 and (b) of FIG. 4, and (a) of FIG. 8 and (b) of FIG. 8, a boundary portion between the display region DA and the frame region NDA (first frame region NDA1) is provided with a non-formation region OP of the first electrode 22 and the peripheral electrode 22' for separating the first electrode 22 and the peripheral electrode 22'.

Note that in the present embodiment, a case is described in which the plurality of openings 22'N of the peripheral electrode 22' overlap the second spacer 23H' or the third spacer 23M, but the present embodiment is not limited to the case, and some openings of the plurality of openings 22'N of the peripheral electrodes 22' may overlap the second spacer 23H' or the third spacer 23M, and the remaining openings of the plurality of openings 22'N of the peripheral electrodes 22' may overlap the edge cover 23L.

(a) of FIG. 6 is a view illustrating the display region DA of the display device 40 according to the first embodiment corresponding to the cross-section of the display panel 1 illustrated in (a) of FIG. 4, and (b) of FIG. 6 is a view illustrating the frame region NDA (first frame region NDA1) closest to the display region DA of the display device 40 of the first embodiment corresponding to the cross-section of the display panel 1 illustrated in (b) of FIG. 4.

(a) of FIG. 7 is a view illustrating the frame region NDA (second frame region NDA2) of the display device 40 according to the first embodiment corresponding to the cross-section of the display panel 1 illustrated in (a) of FIG. 5, and (b) of FIG. 7 is a view illustrating the frame region NDA (third frame region NDA3) farthest from the display region DA of the display device 40 of the first embodiment corresponding to the cross-section of the display panel 1 illustrated in (b) of FIG. 5.

(a) of FIG. 10 is a view illustrating the display region DA of the display device 40 according to the first embodiment corresponding to the cross-section of the display panel 1 illustrated in (a) of FIG. 8, and (b) of FIG. 10 is a view illustrating the frame region NDA (first frame region NDA1) closest to the display region DA of the display device 40 of the first embodiment corresponding to the cross-section of the display panel 1 illustrated in (b) of FIG. 8.

(a) of FIG. 11 is a view illustrating the frame region NDA (second frame region NDA2) of the display device 40 according to the first embodiment corresponding to the cross-section of the display panel 1 illustrated in (a) of FIG. 9, and (b) of FIG. 11 is a view illustrating the frame region NDA (third frame region NDA3) farthest from the display region DA of the display device 40 of the first embodiment corresponding to the cross-section of the display panel 1 illustrated in (b) of FIG. 9.

As illustrated in (a) of FIG. 6 and (a) of FIG. 10, in the display region DA of display device 40, the light-emitting element layers 5R, 5B . . . including the first electrode 22, the light-emitting layers 24R, 24B . . . , and the second electrode 25 in this order are formed. The light-emitting element layer 5R is a layer including a light-emitting element that emits red light, and the light-emitting element layer 5B is a layer including a light-emitting element that emits blue light. Note that although not illustrated in (a) of FIG. 6 and (a) of FIG. 10, in the display region DA of display device 40, a light-emitting element layer including a light-emitting element that emits green light is also formed.

Although not illustrated in (a) of FIG. 6 and (a) of FIG. 10, the light-emitting element layers 5R, 5B, . . . provided in the display region DA of display device 40 may further include at least one of a hole injection layer and a hole transport layer between the first electrode 22 and the light-emitting layers 24R, 24B, . . . and may further include at least one of an electron transport layer and an electron injection layer between the light-emitting layers 24R, 24B, . . . and the second electrode 25.

The display device 40 includes, for each subpixel, the first electrode 22 having the island shape, the light-emitting layers 24R, 24B, . . . , and the second electrode 25.

the first electrode 22 is provided for each subpixel, and the second electrode 25 is provided in common with all of the subpixels.

As illustrated in (a) of FIG. 6 and (b) of FIG. 6, (a) of FIG. 7 and (b) of FIG. 7, (a) of FIG. 10 and (b) of FIG. 10, and (a) of FIG. 11 and (b) of FIG. 11, the sealing layer 6 including the organic sealing layer 31 is provided
  on the side opposite to the substrate 10 side in at least part of the frame region NDA (the first frame region NDA1 to the third frame region NDA3) and in the display region DA of the display device 40.

The sealing layer 6 is a light transmissive layer and includes a first inorganic sealing film 30 that covers the second electrode 25, an organic sealing layer 31 formed on a side above the first inorganic sealing film 30, and a second inorganic sealing film 32 that covers the organic sealing layer 31. The sealing layer 6 that covers the light-emitting element layers 5R, 5B, . . . inhibits foreign matters such as water and oxygen from penetrating the light-emitting element layers 5R, 5B, . . . .

Each of the first inorganic sealing film 30 and the second inorganic sealing film 32 may include, for example, a silicon oxide film, a silicon nitride film, or a silicon oxynitride film formed by the CVD, or a layered film of the silicon oxide film, the silicon nitride film, and the silicon oxynitride film. The organic sealing layer 31 is a light-transmitting organic film thicker than the first inorganic sealing film 30 and the second inorganic sealing film 32, and may be formed of a coatable photosensitive organic material such as a polyimide resin or an acrylic resin.

As described above, the present embodiment describes a case in which the sealing layer 6 including the first inorganic sealing film 30, the second inorganic sealing film 32, and the organic sealing layer 31 between the first inorganic sealing film 30 and the second inorganic sealing film 32 is used, but the sealing layer is not limited to the case as long as the sealing layer includes the organic sealing layer.

The second electrode 25 is the common electrode in the display region DA and extends from the display region DA to the frame region NDA (the first frame region NDA1 to the third frame region NDA3). The second electrode 25 is electrically connected to the peripheral electrode 22'.

As illustrated in (b) of FIG. 7 and (b) of FIG. 11, in the frame region NDA (third frame region NDA3) of the display device 40, the organic sealing layer 31 included in the sealing layer 6 is formed to a portion contacting the first bank BK1.

As illustrated in (a) of FIG. 6 and (b) of FIG. 6, (a) of FIG. 7 and (b) of FIG. 7, (a) of FIG. 10 and (b) of FIG. 10, and (a) of FIG. 11 and (b) of FIG. 11, in the display device 40, by providing the plurality of third spacers 23M described above, the organic sealing layer 31 can be formed to be flat in the entirety from the display region DA to the frame region NDA (the first frame region NDA1 to the third frame region NDA3), achieving the display device 40 having improved display quality and frame narrowing by suppressing occurrence of display unevenness.

In the present embodiment, as illustrated in (a) of FIG. 6 and (b) of FIG. 6, (a) of FIG. 7 and (b) of FIG. 7, (a) of FIG. 10 and (b) of FIG. 10, and (a) of FIG. 11 and (b) of FIG. 11, a case is described as an example in which the glass substrate is used as the substrate 10, but the present embodiment is not limited to the case, and when the display device 40 is formed as a flexible display device, the substrate 10 may be peeled off from the resin film 12 by a laser lift off step (LLO step) to form the flexible display device. After the substrate 10 is peeled off from the resin film 12 by the LLO step, a film may be attached to the resin film 12 via an adhesive layer to form the flexible display device.

Figure 12:
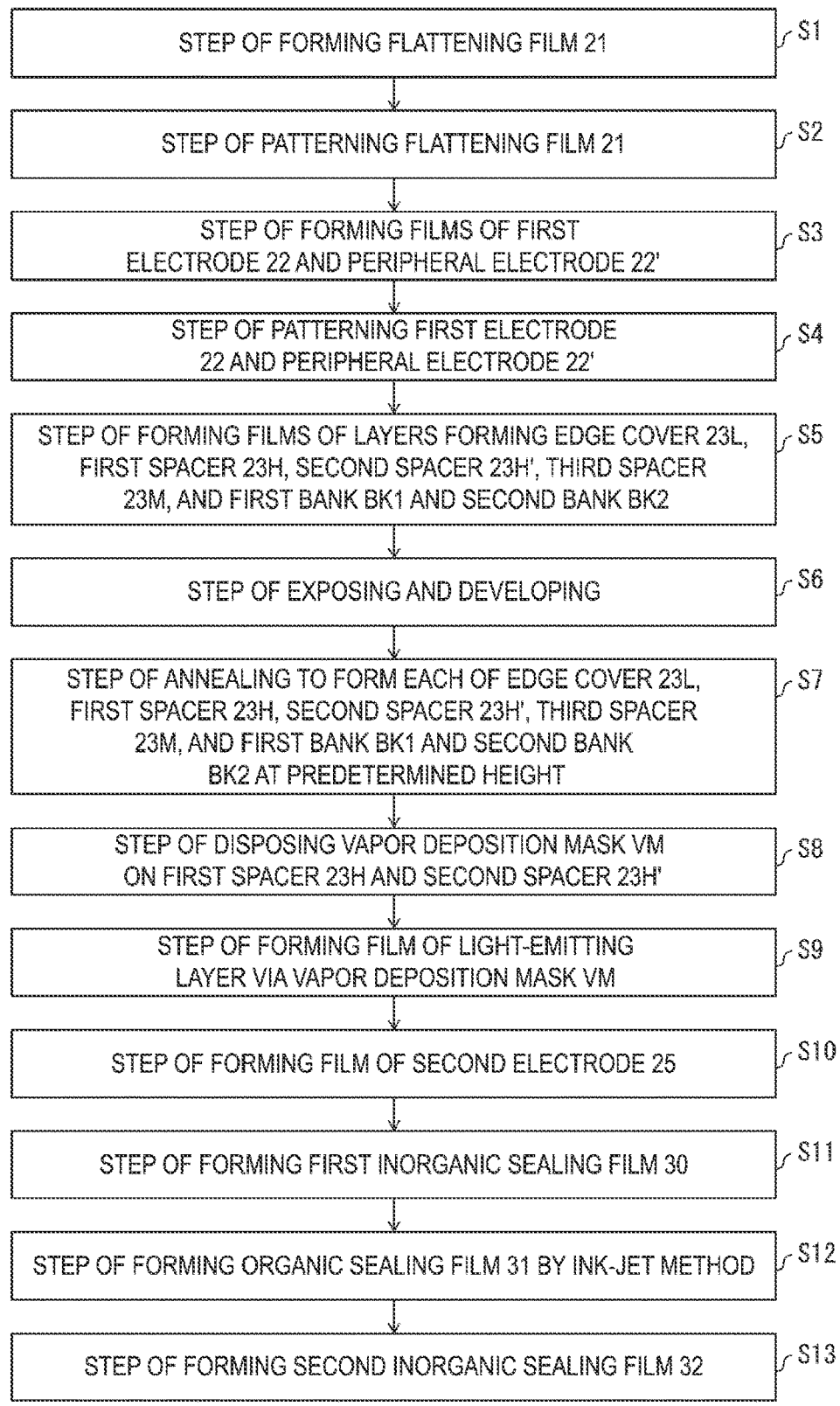
FIG. 12 is a diagram for describing the display device manufacturing method according to the first embodiment.

FIG. 12 is a diagram for describing a manufacturing method of the display device 40 according to the first embodiment.

A step of forming the thin film transistor layer 4 on the substrate 10 includes a step (S1) of forming the flattening film 21 and a step (S2) of patterning the flattening film 21. In the step (S2) of patterning the flattening film 21, the first slit SL1, the second slit SL2, and the trench TREN are formed in the frame region NDA, and a contact hole for electrically connecting the drain electrode SE3 of the transistor TR2 and the first electrode 22 is formed in the display region DA.

A step of forming the first electrode 22 and the peripheral electrode 22' with the same material to form the first electrode 22 in the display region DA and the peripheral electrode 22' in the frame region NDA around the display region DA includes a step (S3) of forming films the first electrode 22 and the peripheral electrode 22' and a step (S4) of patterning the first electrode 22 and the peripheral electrode 22'. In the step (S4) of patterning the first electrode 22 and the peripheral electrode 22', the peripheral electrode 22' having the plurality of openings 22'N is formed in the frame region NDA, and the first electrode 22 having the island shape is formed in the display region DA. In the present embodiment, a case will be described as an example in which the peripheral electrode 22' and the first electrode 22 are formed of the same material, but the present embodiment is not limited to the case, and the peripheral electrode 22' and the first electrode 22 may be formed by different steps using different materials.

A step of forming the edge cover 23L and a step of forming the spacers include a step (S5) of forming films layers forming the edge cover 23L, the first spacer 23H and the second spacer 23H' the third spacer 23M, and the first bank BK1 and second bank BK2, a step (S6) of exposing and developing, and a step (S7) of annealing to form each of the edge cover 23L, the first spacer 23H and the second spacer 23H', the third spacer 23M, and the first bank BK1 and the second bank BK2 at a predetermined height. Note that in the present embodiment, the step of forming the edge cover 23L and the step of forming the spacers are performed simultaneously. In the present embodiment, a case will be described in which the edge cover 23L, the first spacer 23H, the second spacer 23H', and the third spacer 23M are formed by one step using the same material, but the present embodiment is not limited to the case, and the edge cover 23L, the first spacer 23H, the second spacer 23H', and the third spacer 23M may be formed by different steps using different materials.

Note that layers forming the edge cover 23L, the first spacer 23H, the second spacer 23H', the third spacer 23M, and the first bank BK1 and second bank BK2 may be formed by film formation of, for example, a coatable photosensitive organic material such as a polyimide resin or an acrylic resin.

In a step (S6) of exposing and developing, the coated photosensitive organic material is exposed using a grey-tone mask, and then developed. In the present embodiment, since the coated photosensitive organic material is negative-working, a gray-tone mask is used in which the edge cover 23L formed in the display region DA and the frame region NDA is exposed to a first accumulated light amount, the edge cover 23L and the first spacer 23H formed in the display region DA, the edge cover 23L and the second spacer 23H', and the first bank BK1 and the second bank BK2 formed in the frame region NDA are exposed to a second accumulated light amount, the edge cover 23L and the third spacer 23M formed in the frame region NDA are exposed to a third accumulated light amount, and the opening 23K of the edge cover 23L in the display region DA and the removal region 23K' of the edge cover 23L in the frame region NDA are exposed to a fourth accumulated light amount. Magnitudes of the accumulated light amounts of the exposure light are the second accumulated light amount>the third accumulated light amount>the first accumulated light amount>the fourth accumulated light amount. Note that the fourth accumulated light amount may be zero.

In the present embodiment, a case is described as an example in which the height of the first bank BK1 and the height of the second bank BK2 are equal to the height of the first spacer 23H and the height of the second spacer 23H', but the present embodiment is not limited to the case, and, for example, each of the height of the first bank BK1 and the height of the second bank BK2 may be different from the height of the first spacer 23H and the height of the second spacer 23H'.

When the coated photosensitive organic material is positive-working, the magnitudes of the accumulated light amounts of the exposure light are the second accumulated light amount<the third accumulated light amount<the first accumulated light amount<the fourth accumulated light amount.

Subsequently, a step (S8) of disposing the vapor deposition mask VM on the first spacer 23H and the second spacer 23H', a step (S9) of forming a film the light-emitting layer via the vapor deposition mask VM, and a step (S10) of forming the second electrode 25 which is a common electrode in the display region DA and extends from the display region DA to the frame region NDA are performed, and thus the light-emitting element layers 5R, 5B, ... can be provided on the thin film transistor layer 4 of the substrate 10.

Thereafter, a step (S11) of forming the first inorganic sealing film 30, a step (S12) of forming a film the organic sealing layer 31 by the ink-jet method, and a step (S13) of forming the second inorganic sealing film 32, which are steps of forming the sealing layer 6, were performed to form the sealing layer 6 on the side opposite to the substrate 10 side of part of the frame region NDA and the display region DA.

Second Embodiment

Next, a second embodiment of the disclosure will be described with reference to FIG. 13 and FIG. 14. A first spacer 33H, a second spacer 33H', and a third spacer 33M provided in the display device of the present embodiment are different from the first embodiment in that they are formed of a material different from that of the edge cover 23L, and the other configurations are as described in the first embodiment. For convenience of explanation, components having the same functions as those described in diagrams of the first embodiment are appended with the same reference signs, and descriptions thereof may be omitted.

Figure 13:
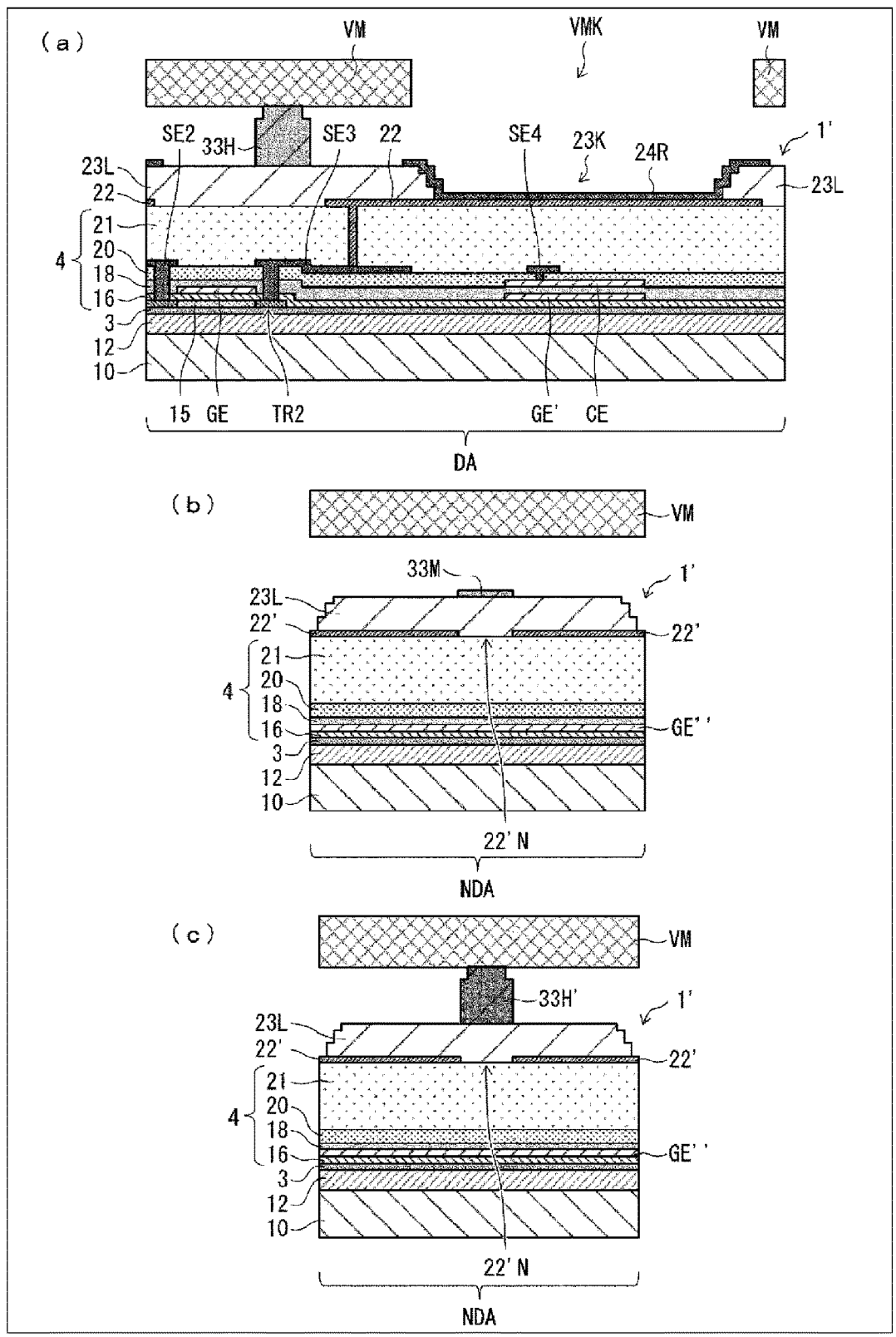
FIG. 13(*a*) is a view illustrating a display region of a display panel provided in a display device according to a second embodiment, and FIGS. 13(*b*) and (*c*) are views illustrating frame regions of the display panel provided in the display device according to the second embodiment.

(a) of FIG. 13 is a view illustrating a display region DA of a display panel 1' provided in a display device according to the second embodiment, and (b) of FIG. 13 and (c) of FIG. 13 are views illustrating frame regions NDA of the display panel 1' provided in the display device according to the second embodiment.

As illustrated in (a) of FIG. 13, (b) of FIG. 13, and (c) of FIG. 13, the edge cover 23L formed in the display region DA and the frame region NDA of the display panel 1' may be formed of, for example, a coatable photosensitive organic material including a polyimide resin, and the first spacer 33H formed in the display region DA of the display panel 1' and the second spacer 33H' and the third spacer 33M formed in the frame region NDA of the display panel 1' may be formed of an coatable photosensitive organic material including an acrylic resin. The present embodiment is not limited to the configuration, and the edge cover 23L formed in the display region DA and the frame region NDA of the display panel 1' may be formed of a coatable photosensitive organic material including an acrylic resin, and the first spacer 33H formed in the display region DA of the display panel 1' and the second spacer 33H' and the third spacer 33M formed in the frame region NDA of the display panel 1' may be formed of an coatable photosensitive organic material including an polyimide resin.

As described above, in the present embodiment, the edge cover 23L and the first spacer 33H, the second spacer 33H', and the third spacer 33M may be formed of two different materials, and thus can have a variety of characteristics as compared with a case of being formed of one material.

Figure 14:
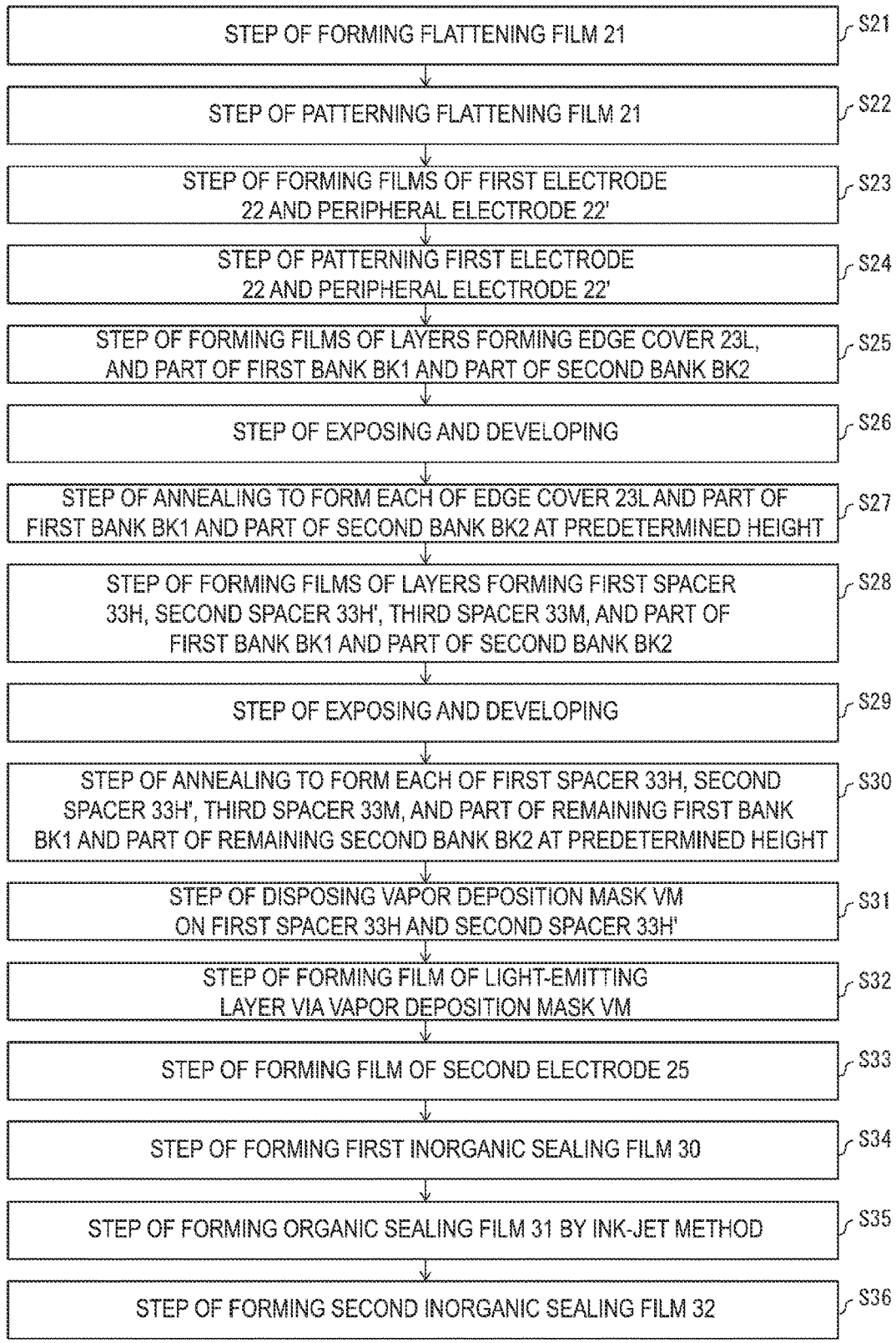
FIG. 14 is a diagram for describing the display device manufacturing method according to the second embodiment.

FIG. 14 is a diagram for describing the display device manufacturing method according to the second embodiment.

The steps S21 to S24 illustrated in FIG. 14 are the same as the steps S1 to S4 described above in the first embodiment, and thus the description here is omitted.

A step of forming the edge cover 23L includes a step (S25) of forming films layers forming the edge cover 23L and part of the first bank BK1 and part of the second bank BK2 and a step (S26) of exposing and developing, and a step (S27) of annealing to form each of the edge cover 23L and the part of the first bank BK1 and the part of the second bank BK2 at a predetermined height.

The height of the edge cover 23L and the height of the part of the first bank BK1 and the height of the part of the second bank BK2 can be the same, and thus, in the step of forming the edge cover 23L, a normal mask can be used without using the gray-tone mask. That is, in the present embodiment, since the coated photosensitive organic material is negative-working, the edge cover 23L formed in the display region DA and the frame region NDA and the part of the first bank BK1 and the part of the second bank BK2 formed in the frame region NDA are exposed to a fifth accumulated light amount, and the opening 23K of the edge cover 23L in the display region DA and the removal region 23K' of the edge cover 23L in the frame region NDA are exposed to a sixth accumulated light amount. Note that the sixth accumulated light amount may be zero.

A step of forming the spacers includes a step (S28) of forming films layers forming the first spacer 33H and the second spacer 33H' the third spacer 33M, and part of remaining first bank BK1 and part of remaining second bank BK2, a step (S29) of exposing and developing, and a step (S30) of annealing to form each of the first spacer 33H and the second spacer 33H', the third spacer 33M, the part of the remaining first bank BK1 and the part of the remaining second bank BK2 at a predetermined height.

In the present embodiment, since the coated photosensitive organic material is negative-working, the grey-tone mask was used in which the first spacer 33H formed in the display region DA, the second spacer 33H', the part of the remaining first bank BK1, and the part of the remaining second bank BK2 formed in the frame region NDA are exposed to a seventh accumulated light amount, and the third spacer 33M formed in the frame region NDA is exposed to an eighth accumulated light amount. The magnitudes of the accumulated light amounts of the exposure light are the seventh accumulated light amount>the eighth accumulated light amount.

Note that in the present embodiment, after the step of forming the edge cover 23L, the step of forming the spacers is performed, and the material for forming the edge cover 23L and used in the step of forming the edge cover 23L is the coatable photosensitive organic material including the polyimide resin, and the material for forming the spacer and used in the step of forming the spacer is the coatable photosensitive organic material including the acrylic resin.

Thereafter, by performing steps S31 to S33 illustrated in FIG. 14, the light-emitting element layers 5R, 5B, . . . was provided on the thin film transistor layer 4 of the substrate 10, and by performing steps S34 to S36 illustrated in FIG. 14, the sealing layer 6 was formed on the side opposite to the substrate 10 side of the part of the frame region NDA and the display region DA. Note that the steps S31 to S36 illustrated in FIG. 14 are the same as the steps S8 to S13 described above in the first embodiment, and thus the description here is omitted.

Third Embodiment

Next, a third embodiment of the disclosure will be described with reference to FIG. 15 and FIG. 16. The display device according to the present embodiment differs from the first embodiment in that each of the plurality of third spacer groups 23MG is provided in the frame region NDA close to the display region DA from the trench TREN, and each of the plurality of second spacer groups 23H'G is provided in the frame region NDA distal to the trench TREN from the display region DA, and the other configurations are as described in the first embodiment. For convenience of explanation, components having the same functions as those described in diagrams of the first embodiment are appended with the same reference signs, and descriptions thereof may be omitted.

Figure 15:
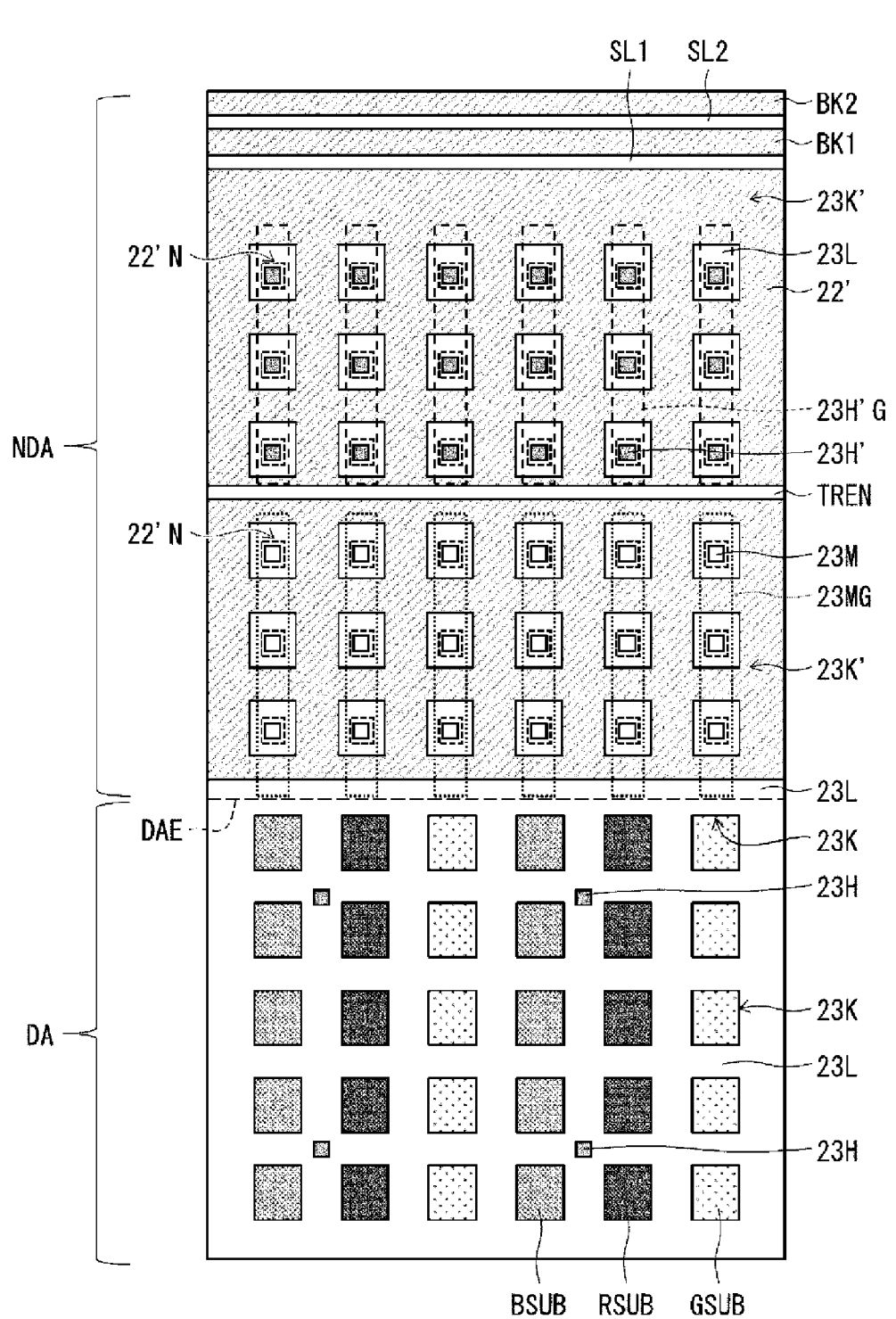
FIG. 15 is a plan view illustrating part of a display panel provided in a display device according to a third embodiment.

FIG. 15 is a plan view illustrating part of a display panel 1" provided in the display device according to the third embodiment.

Figure 16:
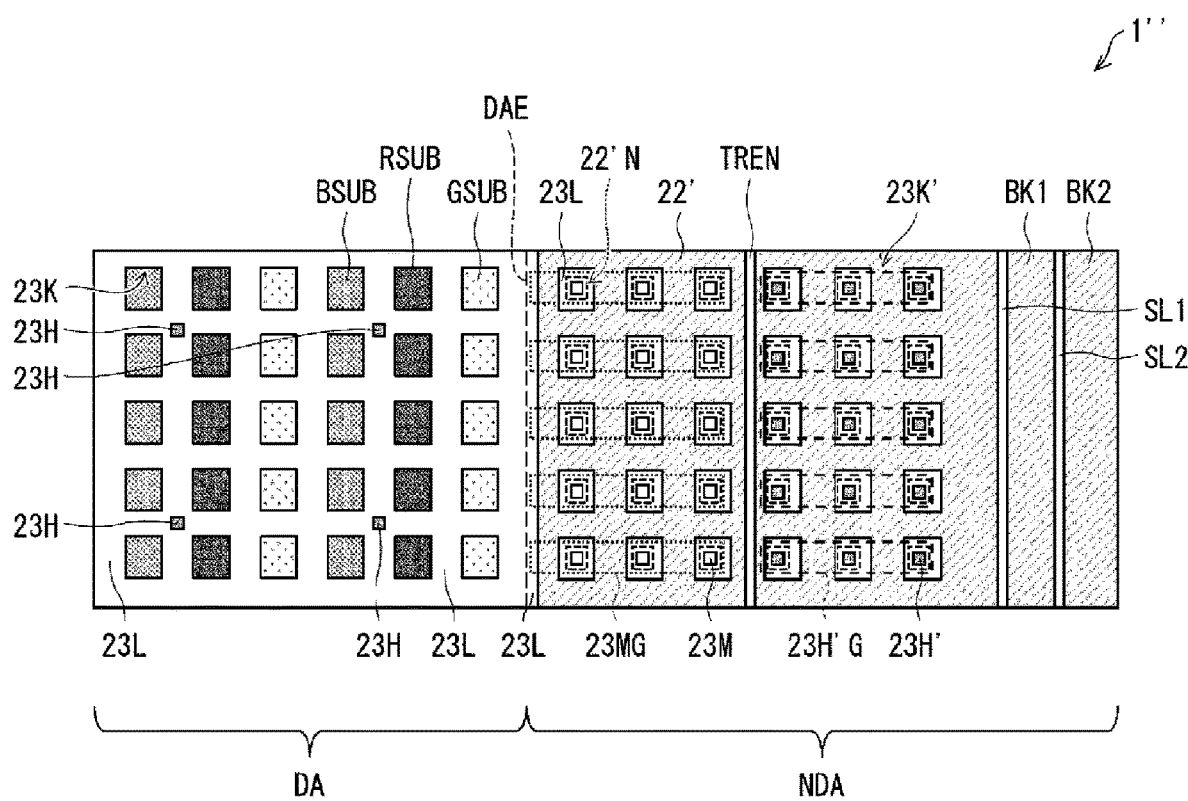
FIG. 16 is a plan view illustrating another part of the display panel provided in the display device according to the third embodiment.
Figure 17:
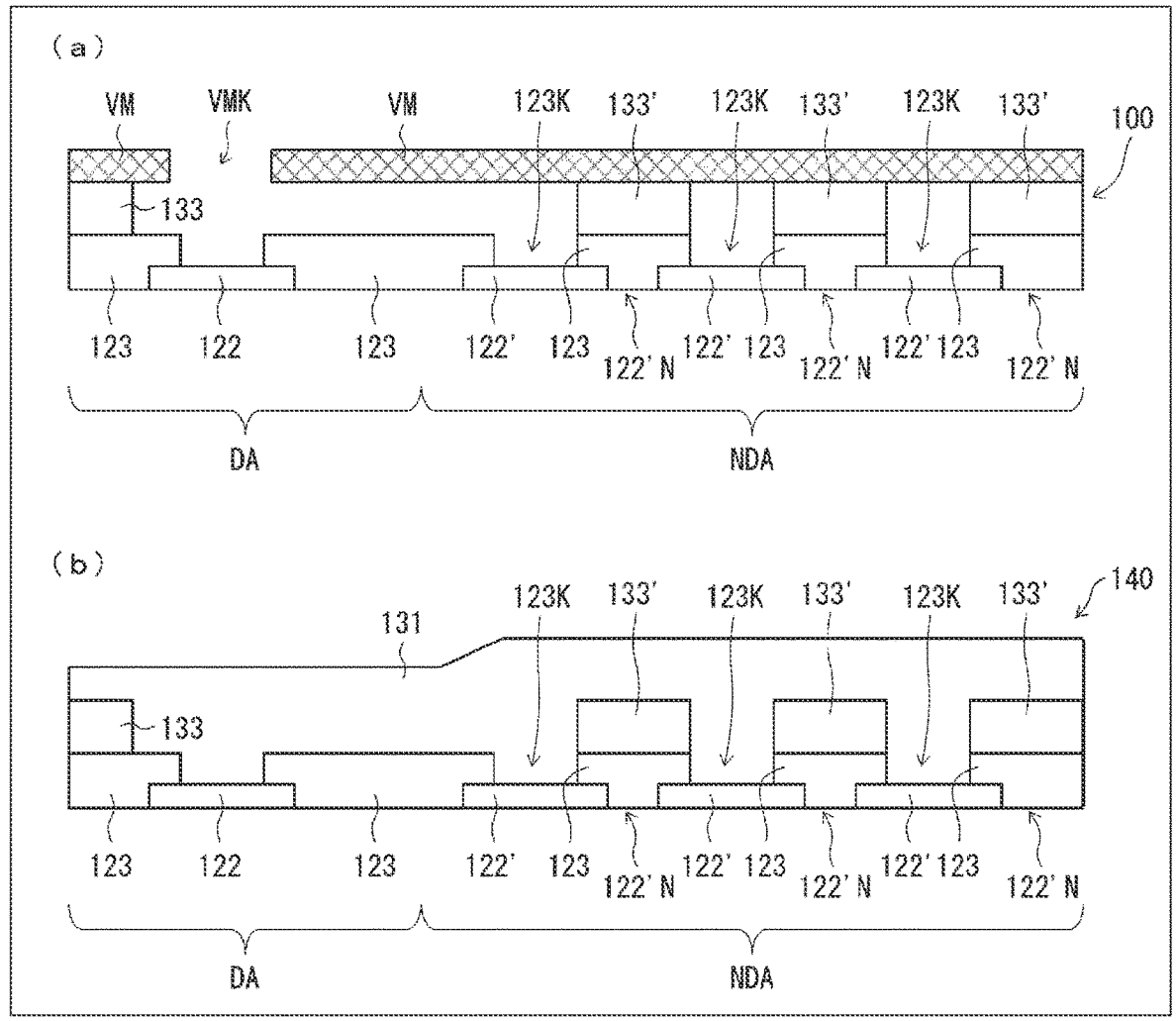
FIGS. 17(*a*) and (*b*) are views for describing problems when the light-emitting layers having different colors of the plurality of types are formed by the vapor deposition method using a vapor deposition mask, and a resin layer included in the sealing layer is formed using the ink-jet method.

FIG. 16 is a plan view illustrating another part of the display panel 1" provided in the display device according to the third embodiment. Note that the display panel 1" is obtained in the middle of the manufacturing process of the display device according to the third embodiment.

As illustrated in FIG. 15 and FIG. 16, each of the plurality of third spacer groups 23MG is provided in the frame region NDA close to the display region DA from the trench TREN, and each of the plurality of second spacer groups 23H'G is provided in the frame region NDA distal to the trench TREN from the display region DA.

According to the display device including the display panel 1" of the present embodiment, providing the plurality of third spacers 23M in the frame region NDA close to the display region DA from the trench TREN allows the organic sealing layer 31 to be flatly formed in at least the display region DA near the frame region NDA, achieving the display device having improved display quality and frame narrowing by suppressing occurrence of display unevenness.

SUPPLEMENT

First Aspect

A display device including
a substrate,
a thin film transistor layer provided on the substrate,
a display region and a frame region around the display region, the display region and the frame region including the substrate and the thin film transistor layer,
a light-emitting element layer provided in the display region and including a first electrode, a light-emitting layer, and a second electrode in this order from the thin film transistor layer side,
a peripheral electrode provided in the frame region and including a plurality of openings,
an edge cover configured to cover an edge of the first electrode and an edge of the peripheral electrode,
a plurality of spacers provided in the display region and the frame region, and
a sealing layer provided on a side opposite to the substrate side in at least part of the frame region and in the display region and including a resin layer,
wherein the plurality of spacers includes a plurality of first spacers provided on the edge cover in the display region and a plurality of second spacers and a plurality of third spacers provided on the edge cover in the frame region,
a total height of a height of the edge cover in the frame region and a height of each of the plurality of second spacers is equal to a total height of a height of the edge cover in the display region and a height of each of the plurality of first spacers,
a total height of a height of the edge cover in the frame region and a height of each of the plurality of third spacers is lower than a total height of the height of the edge cover in the frame region and the height of each of the plurality of second spacers,
a first density obtained by dividing the number of the plurality of first spacers by an area of the display region is smaller than a second density obtained by dividing the number of the plurality of second spacers by an area of the frame region,
a plurality of third spacer groups including a plurality of adjacent third spacers of the plurality of third spacers is provided, and
each of the plurality of third spacer groups is provided in parallel to each other and in a direction intersecting an edge of the display region.

Second Aspect

The display device according to aspect 1,
wherein a plurality of second spacer groups including a plurality of adjacent second spacers of the plurality of second spacers is provided, and
each of the plurality of third spacer groups and each of the plurality of second spacer groups are provided in parallel to each other.

Third Aspect

The display device according to aspect 2,
wherein each of the plurality of the second spacer groups and each of the plurality of the third spacer groups are alternately provided in a direction along an edge of the display region.

Fourth Aspect

The display device according to aspect 2 or 3,
wherein the thin film transistor layer includes a flattening film,
a groove extending along the edge of the display region is formed in the frame region in the flattening film, and
the groove intersects the plurality of second spacer groups and the plurality of third spacer groups.

Fifth Aspect

The display device according to aspect 2 wherein the thin film transistor layer includes a flattening film,
a groove extending along the edge of the display region is formed in the frame region in the flattening film,
each of the plurality of third spacer groups is provided in the frame region close to the display region from the groove, and
each of the plurality of second spacer groups is provided in the frame region distal to the groove from the display region.

Sixth Aspect

The display device according to any one of aspects 1 to 5,
wherein each of the plurality of openings overlaps a respective one of the plurality of second spacers or a respective one of the plurality of third spacers.

Seventh Aspect

The display device according to any one of aspects 1 to 6,
wherein the thin film transistor layer includes a flattening film, and
the peripheral electrode contacts the flattening film.

Eighth Aspect

The display device according to any one of aspects 1 to 7,
wherein the second electrode is a common electrode in the display region and extends from the display region to the frame region, and
the second electrode is electrically connected to the peripheral electrode.

Ninth Aspect

The display device according to any one of aspects 1 to 5,
wherein some openings of the plurality of openings overlap the plurality of second spacers or the plurality of third spacers, and
the remaining openings of the plurality of openings overlap the edge cover.

Tenth Aspect

The display device according to aspect 4 or 5,
wherein the flattening film is a polyimide resin or an acrylic resin.

Eleventh Aspect

The display device according to any one of aspects 1 to 10,
wherein the edge cover, the plurality of first spacers, the plurality of second spacers, and the plurality of third spacers are the same material.

Twelfth Aspect

The display device according to any one of aspects 1 to 10,
wherein the edge cover, the plurality of first spacers, the plurality of second spacers, and the plurality of third spacers are different materials.

Thirteenth Aspect

The display device according to any one of aspects 1 to 12,
wherein one or more banks formed along the edge of the display region are provided in the frame region distal to the plurality of second spacers and the plurality of third spacers from the display region.

Fourteenth Aspect

A display device manufacturing method including
forming a thin film transistor layer on a substrate,
forming a first electrode in a display region and forming a peripheral electrode in a frame region around the display region,
forming an edge cover to cover an edge of the first electrode and an edge of the peripheral electrode,
forming a plurality of first spacers on the edge cover in the display region, forming a plurality of second spacers on the edge cover in the frame region such that a total height of a height of the edge cover in the frame region and a height of each of the plurality of second spacers is equal to a total height of a height of the edge cover in the display region and a height of each of the plurality of first spacers, and forming a plurality of third spacers on the edge cover in the frame region such that a total height of a height of the edge cover in the frame region and a height of each of the plurality of third spacers is lower than a total height of a height of the edge cover in the frame region and a height of each of the plurality of second spacers,
disposing a vapor deposition mask on the plurality of first spacers and the plurality of second spacers,
forming a light-emitting layer via the vapor deposition mask,
forming a second electrode that is a common electrode in the display region and extends from the display region to the frame region, and
forming a sealing layer on a side opposite to the substrate side in at least part of the frame region and in the display region and including a resin layer,
wherein in the forming a plurality of first spacers, a plurality of second spacers, and a plurality of third spacers, the plurality of first spacers and the plurality of second spacers are formed such that a first density obtained by dividing the number of the plurality of first spacers by an area of the display region is smaller than a second density obtained by dividing the number of the plurality of second spacers by an area of the frame region, a plurality of third spacer groups including a plurality of adjacent third spacers of the plurality of third spacers is formed, and each of the plurality of third spacer groups is disposed in parallel to each other and in a direction intersecting an edge of the display region.

Fifteenth Aspect

The display device manufacturing method according to aspect 14, wherein in the forming a first electrode and a peripheral electrode, the first electrode and the peripheral electrode are formed of the same material.

Sixteenth Aspect

The display device manufacturing method according to aspect 14 or 15, wherein the forming an edge cover and the forming a plurality of first spacers, a plurality of second spacers, and a plurality of third spacers are performed simultaneously, and the plurality of first spacers, the plurality of second spacers, the plurality of third spacers, and the edge cover are formed of the same material by exposing using a gray-tone mask and developing.

Seventeenth Aspect

The display device manufacturing method according to any one of aspects 14 to 16, wherein in the forming a sealing layer, the resin layer is formed by an ink-jet method.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device and a method for manufacturing the display device.

The invention claimed is:

1. A display device comprising:
a substrate;
a thin film transistor layer provided on the substrate;
a display region and a frame region around the display region, the display region and the frame region including the substrate and the thin film transistor layer,
a light-emitting element layer provided in the display region and including a first electrode, a light-emitting layer, and a second electrode in this order from a thin film transistor layer side;
a peripheral electrode provided in the frame region and including a plurality of openings;
an edge cover configured to cover an edge of the first electrode and an edge of the peripheral electrode;
a plurality of spacers provided in the display region and the frame region; and
a sealing layer provided on a side opposite a substrate side in at least part of the frame region and in the display region, and including a resin layer,
wherein the plurality of spacers includes; a plurality of first spacers provided on the edge cover in the display region; and a plurality of second spacers and a plurality of third spacers provided on the edge cover in the frame region,
a first total height, being a sum of a height of the edge cover in the frame region and a height of each of the plurality of second spacers, is equal to a second total height, being a sum of a height of the edge cover in the display region and a height of each of the plurality of first spacers,
a third total height, being a sum of a height of the edge cover in the frame region and a height of each of the plurality of third spacers, is lower than the first total height,
a first density, obtained by dividing a number of the plurality of first spacers by an area of the display region, is smaller than a second density, obtained by dividing a number of the plurality of second spacers by an area of the frame region,
a plurality of third spacer groups, including a plurality of adjacent third spacers among the plurality of third spacers, is provided,
each of the plurality of third spacer groups is provided in parallel to each other and in a direction intersecting an edge of the display region;
a plurality of second spacer groups, including a plurality of adjacent second spacers among the plurality of second spacers, is provided,
each of the plurality of third spacer groups and each of the plurality of second spacer groups are provided in parallel to each other, and
each of the plurality of the second spacer groups and each of the plurality of the third spacer groups are alternately provided in a direction along the edge of the display region.

2. The display device according to claim 1,
wherein the thin film transistor layer includes a flattening film,
a groove extending along the edge of the display region is formed in the frame region in the flattening film, and
the groove intersects the plurality of second spacer groups and the plurality of third spacer groups.

3. The display device according to claim 1,
wherein the thin film transistor layer includes a flattening film,
a groove extending along the edge of the display region is formed in the frame region in the flattening film,
each of the plurality of third spacer groups is provided in the frame region on a side of the display region with respect to the groove, and
each of the plurality of second spacer groups is provided in the frame region on another side opposite the side of the display region with respect to the groove.

4. The display device according to claim 1,
wherein each of the plurality of openings overlaps a respective one of the plurality of second spacers or a respective one of the plurality of third spacers.

5. The display device according to claim 1,
wherein the thin film transistor layer includes a flattening film, and
the peripheral electrode contacts the flattening film.

6. The display device according to claim 1,
wherein the second electrode is a common electrode in the display region and extends from the display region to the frame region, and
the second electrode is electrically connected to the peripheral electrode.

7. The display device according to claim 1,
wherein some openings of the plurality of openings overlap the plurality of second spacers or the plurality of third spacers, and
the remaining openings of the plurality of openings overlap the edge cover.

8. The display device according to claim 1,
wherein the edge cover, the plurality of first spacers, the plurality of second spacers, and the plurality of third spacers are made of a same material.

9. The display device according to claim 1,
wherein the edge cover, the plurality of first spacers, the plurality of second spacers, and the plurality of third spacers are made of different materials.

10. The display device according to claim 1,
wherein one or more banks formed along the edge of the display region are provided in the frame region that is farther from the display region than the plurality of second spacers and the plurality of third spacers.

11. A display device comprising:
a substrate;
a thin film transistor layer provided on the substrate;
a display region and a frame region around the display region, the display region and the frame region including the substrate and the thin film transistor layer;
a light-emitting element layer provided in the display region and including a first electrode, a light-emitting layer, and a second electrode in this order from a thin film transistor layer side;
a peripheral electrode provided in the frame region and including a plurality of openings;
an edge cover configured to cover an edge of the first electrode and an edge of the peripheral electrode;
a plurality of spacers provided in the display region and the frame region; and
a sealing layer provided on a side opposite a substrate side in at least part of the frame region and in the display region, and including a resin layer,
wherein the plurality of spacers includes: a plurality of first spacers provided on the edge cover in the display region; and a plurality of second spacers and a plurality of third spacers provided on the edge cover in the frame region,
a first total height, being a sum of a height of the edge cover in the frame region and a height of each of the plurality of second spacers, is equal to a second total height, being a sum of a height of the edge cover in the display region and a height of each of the plurality of first spacers,
a third total height, being a sum of the height of the edge cover in the frame region and a height of each of the plurality of third spacers, is lower than the first total height,
a first density, obtained by dividing a number of the plurality of first spacers by an area of the display region, is smaller than a second density, obtained by dividing a number of the plurality of second spacers by an area of the frame region,
a plurality of third spacer groups, including a plurality of adjacent third spacers among the plurality of third spacers, is provided,
each of the plurality of third spacer groups is provided in parallel to each other and in a direction intersecting an edge of the display region, and
each of the plurality of openings overlaps a respective one of the plurality of second spacers or a respective one of the plurality of third spacers.

12. The display device of claim 11,
wherein a plurality of second spacer groups, including a plurality of adjacent second spacers among the plurality of second spacers, is provided, and
each of the plurality of third spacer groups and each of the plurality of second spacer groups are provided in parallel to each other.

13. The display device according to of claim 11,
wherein the thin film transistor layer includes a flattening film, and
the peripheral electrode contacts the flattening film.

14. The display device according to of claim 11,
wherein the second electrode is a common electrode in the display region and extends from the display region to the frame region, and
the second electrode is electrically connected to the peripheral electrode.

15. The display device according to of claim 11,
wherein some openings of the plurality of openings overlap the plurality of second spacers or the plurality of third spacers, and
the remaining openings of the plurality of openings overlap the edge cover.

16. The display device according to of claim 11,
wherein the edge cover, the plurality of first spacers, the plurality of second spacers, and the plurality of third spacers are made of a same material.

17. The display device according to of claim 11,
wherein the edge cover, the plurality of first spacers, the plurality of second spacers, and the plurality of third spacers are made of different materials.

18. The display device according to of claim 11,
wherein one or more banks formed along the edge of the display region are provided in the frame region that is farther from the display region than the plurality of second spacers and the plurality of third spacers.

19. A display device comprising:
a substrate;
a thin film transistor layer provided on the substrate;
a display region and a frame region around the display region, the display region and the frame region including the substrate and the thin film transistor layer;
a light-emitting element layer provided in the display region and including a first electrode, a light-emitting layer, and a second electrode in this order from a thin film transistor layer side;
a peripheral electrode provided in the frame region and including a plurality of openings;
an edge cover configured to cover an edge of the first electrode and an edge of the peripheral electrode;
a plurality of spacers provided in the display region and the frame region; and
a sealing layer provided on a side opposite a substrate side in at least part of the frame region and in the display region, and including a resin layer, wherein the plurality of spacers includes: a plurality of first spacers provided on the edge cover in the display region; and a plurality of second spacers and a plurality of third spacers provided on the edge cover in the frame region, a first total height, being a sum of a height of the edge cover in the frame region and a height of each of the plurality of second spacers, is equal to a second total height, being a sum of a height of the edge cover in the display region and a height of each of the plurality of first spacers, a third total height, being a sum of the height of the edge cover in the frame region and a height of each of the plurality of third spacers, is lower than the first total height, a first density, obtained by dividing a number of the plurality of first spacers by an area of the display region, is smaller than a second density, obtained by dividing a number of the plurality of second spacers by an area of the frame region, a plurality of third spacer groups, including a plurality of adjacent third spacers among the plurality of third spacers, is provided, each of the plurality of third spacer groups is provided in parallel to each other and in a direction intersecting an edge of the display region, the thin film transistor layer includes a flattening film, and the peripheral electrode contacts the flattening film.

20. The display device of claim 19, wherein a plurality of second spacer groups, including a plurality of adjacent second spacers among the plurality of second spacers, is provided, and each of the plurality of third spacer groups and each of the plurality of second spacer groups are provided in parallel to each other.

\* \* \* \* \*